US010394649B2

(12) United States Patent
Alrod et al.

(10) Patent No.: US 10,394,649 B2
(45) Date of Patent: Aug. 27, 2019

(54) FIRST READ SOLUTION FOR MEMORY

(71) Applicant: SanDisk Technologies LLC, Plano, TX (US)

(72) Inventors: Idan Alrod, Herzliya (IL); Eran Sharon, Rishon Lezion (IL); Alon Eyal, Zichron Yaacov (IL); Liang Pang, Fremont, CA (US); Evgeny Mekhanik, Rehovot (IL)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/921,184

(22) Filed: Mar. 14, 2018

(65) Prior Publication Data

US 2018/0203763 A1 Jul. 19, 2018

Related U.S. Application Data

(62) Division of application No. 15/333,440, filed on Oct. 25, 2016, now Pat. No. 9,952,944.

(51) Int. Cl.
*G11C 29/04* (2006.01)
*G06F 11/10* (2006.01)
(Continued)

(52) U.S. Cl.
CPC .......... *G06F 11/1068* (2013.01); *G06F 11/10* (2013.01); *G11C 11/5642* (2013.01); *G11C 16/0483* (2013.01); *G11C 16/08* (2013.01); *G11C 16/10* (2013.01); *G11C 16/26* (2013.01); *G11C 16/32* (2013.01); *G11C 16/3459* (2013.01); *G11C 29/52* (2013.01); *G11C 2207/2281* (2013.01)

(58) Field of Classification Search
CPC . G06F 11/1068; G11C 16/0483; G11C 16/10; G11C 16/08; G11C 16/26; G11C 16/3459
USPC .................................................... 365/185.03
See application file for complete search history.

(56) References Cited

U.S. PATENT DOCUMENTS 5,168,463 A 12/1992 Ikeda et al.
5,491,809 A 2/1996 Coffman et al.
(Continued)

OTHER PUBLICATIONS

Response to Office Action dated Mar. 20, 2018, U.S. Appl. No. 15/440,185, filed Feb. 23, 2017.
(Continued)

*Primary Examiner* — Xiaochun L Chen
(74) *Attorney, Agent, or Firm* — Vierra Magen Marcus LLP

(57) ABSTRACT

Techniques are provided for improving the accuracy of read operations of memory cells, where the threshold voltage of a memory cell can shift depending on when the read operation occurs. A memory cell is sensed by discharging a sense node into a bit line and detecting an amount of discharge at two sense times relative to a trip voltage. A bit of data is stored in first and second latches based on the two sense times, to provide first and second pages of data. The pages are evaluated using parity check equations and one of the pages which satisfies the most equations is selected. In another option, word line voltages are grounded and then floated to prevent coupling up of the word line. A weak pulldown to ground can gradually discharge a coupled up voltage of the word lines.

19 Claims, 34 Drawing Sheets

(51) Int. Cl.
*G11C 16/04* (2006.01)
*G11C 16/08* (2006.01)
*G11C 16/10* (2006.01)
*G11C 16/26* (2006.01)
*G11C 16/34* (2006.01)
*G11C 29/52* (2006.01)
*G11C 11/56* (2006.01)
*G11C 16/32* (2006.01)

(56) References Cited

U.S. PATENT DOCUMENTS

| | | | |
|---|---|---|---|
| 5,555,527 | A | 9/1996 | Kotani et al. |
| 6,343,033 | B1 | 1/2002 | Parker |
| 6,751,146 | B1 | 6/2004 | Wang et al. |
| 7,974,134 | B2 | 7/2011 | Zhang et al. |
| 8,156,398 | B2 | 4/2012 | Sommer |
| 8,406,053 | B1 | 3/2013 | Dutta et al. |
| 8,576,624 | B2 | 11/2013 | Dutta et al. |
| 8,732,537 | B2 | 5/2014 | Zhang et al. |
| 8,908,441 | B1 | 12/2014 | Dutta et al. |
| 9,123,389 | B1 | 9/2015 | Park |
| 9,257,203 | B2 * | 2/2016 | Ratnam ............ G11C 29/42 |
| 9,378,830 | B2 | 6/2016 | Khoueir et al. |
| 9,443,606 | B2 | 9/2016 | Dutta et al. |
| 9,672,926 | B2 * | 6/2017 | Shiino ............ G11C 16/26 |
| 9,711,231 | B1 | 7/2017 | Yip et al. |
| 9,721,671 | B2 | 8/2017 | Chu et al. |
| 9,911,500 | B2 | 3/2018 | Pang et al. |
| 10,061,647 | B2 | 8/2018 | Shim et al. |
| 2003/0085731 | A1 | 5/2003 | Iwase et al. |
| 2005/0195304 | A1 | 9/2005 | Nitta et al. |
| 2007/0183242 | A1 | 8/2007 | Miyamoto |
| 2009/0052255 | A1 | 2/2009 | Moon et al. |
| 2010/0027314 | A1 | 2/2010 | Chevallier et al. |
| 2010/0074026 | A1 | 3/2010 | Kang |
| 2011/0032746 | A1 | 2/2011 | Maejima et al. |
| 2011/0030508 | A1 | 12/2011 | Abe et al. |
| 2012/0221913 | A1 | 8/2012 | Anholt et al. |
| 2012/0257453 | A1 | 10/2012 | Shiino et al. |
| 2013/0051152 | A1 * | 2/2013 | Lee ............ G11C 16/0483 365/185.18 |
| 2013/0070524 | A1 | 3/2013 | Dutta et al. |
| 2013/0135008 | A1 | 5/2013 | Zhang et al. |
| 2013/0148425 | A1 | 6/2013 | Dutta et al. |
| 2013/0235649 | A1 | 9/2013 | Lindstadt et al. |
| 2014/0140148 | A1 | 5/2014 | An |
| 2014/0160845 | A1 * | 6/2014 | Ratnam ............ G11C 29/42 365/185.09 |
| 2014/0198594 | A1 | 7/2014 | McCombs |
| 2014/0340964 | A1 * | 11/2014 | Shiino ............ G11C 16/26 365/185.03 |
| 2014/0346320 | A1 | 11/2014 | Sohn |
| 2014/0355340 | A1 | 12/2014 | Sharon et al. |
| 2015/0023097 | A1 | 1/2015 | Khoueir et al. |
| 2015/0092488 | A1 | 4/2015 | Wakchaure et al. |
| 2015/0318045 | A1 | 11/2015 | Yun |
| 2016/0118135 | A1 | 4/2016 | Dutta et al. |
| 2016/0172051 | A1 | 6/2016 | Liang et al. |
| 2016/0180946 | A1 * | 6/2016 | Hong ............ G11C 16/26 365/185.11 |
| 2016/0203873 | A1 | 7/2016 | Kuribara et al. |
| 2017/0062065 | A1 | 3/2017 | Shim et al. |
| 2017/0236595 | A1 | 8/2017 | Maejima et al. |

OTHER PUBLICATIONS

Final Office Action dated May 25, 2018, U.S. Appl. No. 15/440,185, filed Feb. 23, 2017.
U.S. Appl. No. 15/921,165, filed Mar. 14, 2018, by Alrod et al.
Wolf, Jack Keil, "An Introduction to Error Correcting Codes: Part 3," ECE 154C, Powerpoint, May 2010, 41 pages.
Sommer, Naftali, PhD., "Signal processing and the evolution of NAND flash memory," Embedded Computing Design, vol. 8, No. 8, Dec. 2010, 2 pages.
U.S. Appl. No. 15/333,440, filed Oct. 25, 2016.
Restriction Requirement dated Jun. 15, 2017, U.S. Appl. No. 15/333,440, filed Oct. 25, 2016.
Response to Restriction Requirement dated Jul. 17, 2017, U.S. Appl. No. 15/333,440, filed Oct. 25, 2016.
Non-final Office Action dated Aug. 9, 2017, U.S. Appl. No. 15/333,440, filed Oct. 25, 2016.
Response to Office Action dated Oct. 20, 2017, U.S. Appl. No. 15/333,440, filed Oct. 25, 2016.
Notice of Allowance dated Dec. 11, 2017, U.S. Appl. No. 15/333,440, filed Oct. 25, 2016.
U.S. Appl. No. 15/440,185, filed Feb. 23, 2017.
Restriction Requirement dated Sep. 25, 2017, U.S. Appl. No. 15/440,185, filed Feb. 23, 2017.
Response to Restriction Requirement dated Oct. 18, 2017, U.S. Appl. No. 15/440,185, filed Feb. 23, 2017.
Non-final Office Action dated Dec. 22, 2017, U.S. Appl. No. 15/440,185, filed Feb. 23, 2017.
Non-final Office Action dated Nov. 2, 2016, U.S. Appl. No. 15/191,898, filed Jun. 24, 2016.
Response to Office Action dated Jan. 30, 2017, U.S. Appl. No. 15/191,898, filed Jun. 24, 2016.
Notice of Allowance dated Mar. 10, 2017, U.S. Appl. No. 15/191,898, filed Jun. 24, 2016.
U.S. Appl. No. 15/451,186, filed Mar. 6, 2017.
Restriction Requirement dated Oct. 18, 2017, U.S. Appl. No. 15/451,186, filed Mar. 6, 2017.
Response to Restriction Requirement dated Nov. 8, 2017, U.S. Appl. No. 15/451,186, filed Mar. 6, 2017.
Non-final Office Action dated Nov. 16, 2017, U.S. Appl. No. 15/451,186, filed Mar. 6, 2017.
Response to Office Action dated Feb. 12, 2018, U.S. Appl. No. 15/451,186, filed Mar. 6, 2017.
U.S. Appl. No. 15/816,546, filed Nov. 17, 2017.
Non-final Office Action dated Jan. 2, 2018, U.S. Appl. No. 15/816,546, filed Nov. 17, 2017.
International Search Report & the Written Opinion of the International Searching Authority dated Dec. 11, 2017, International Application No. PCT/US2017/050568.
Non-final Office Action dated Nov. 23, 2018, U.S. Appl. No. 15/921,165, filed Mar. 14, 2018.

* cited by examiner

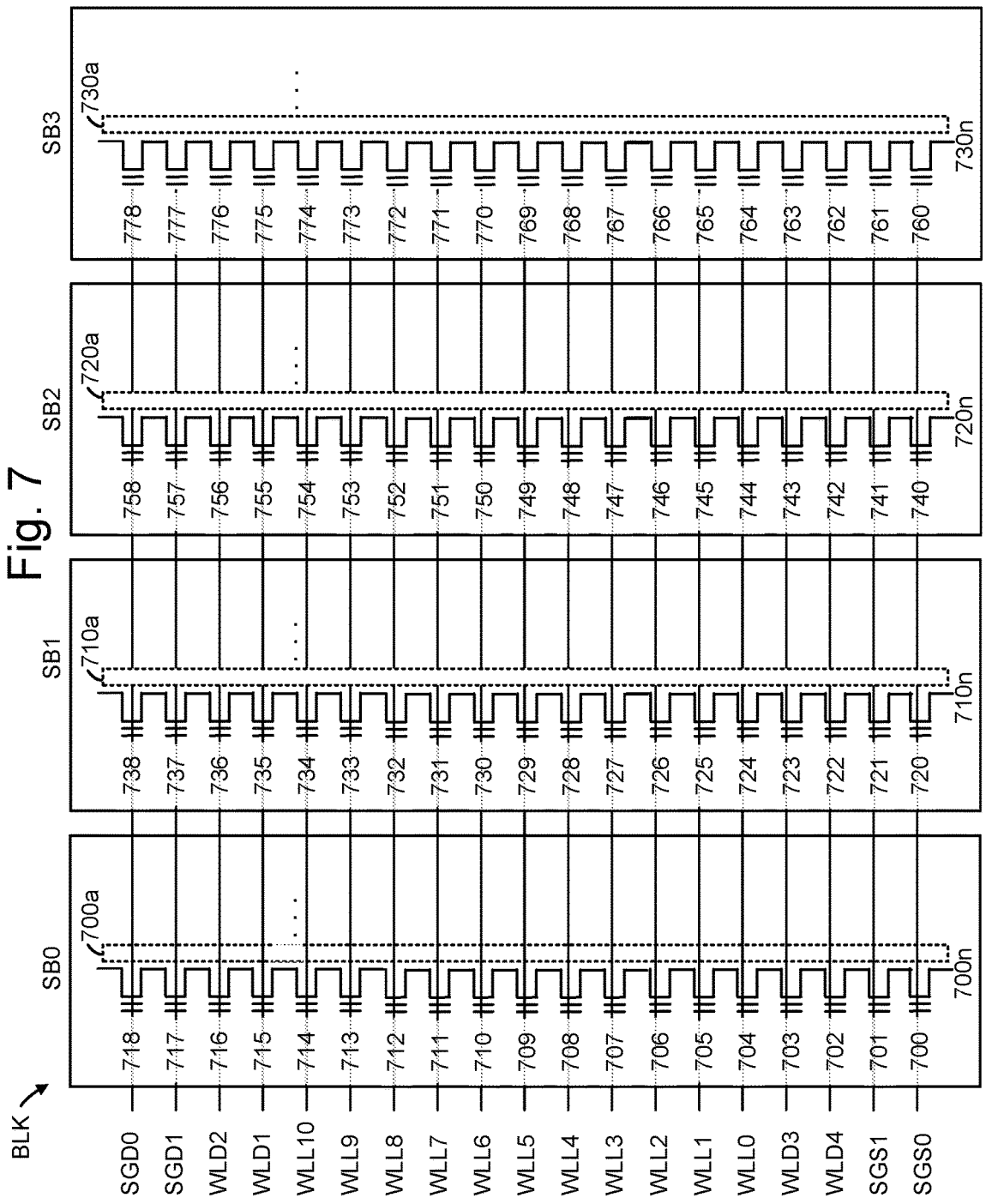

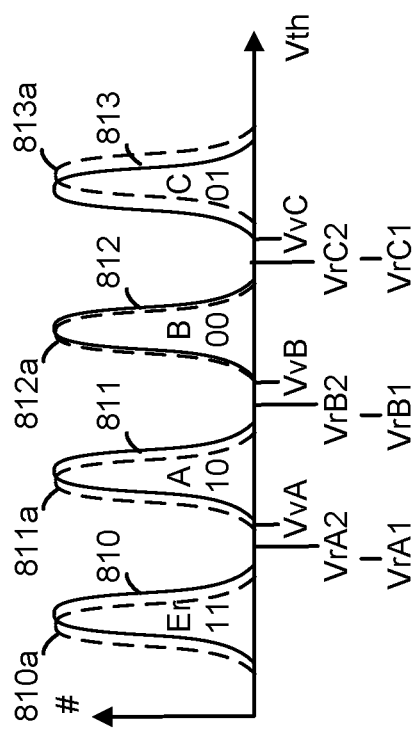

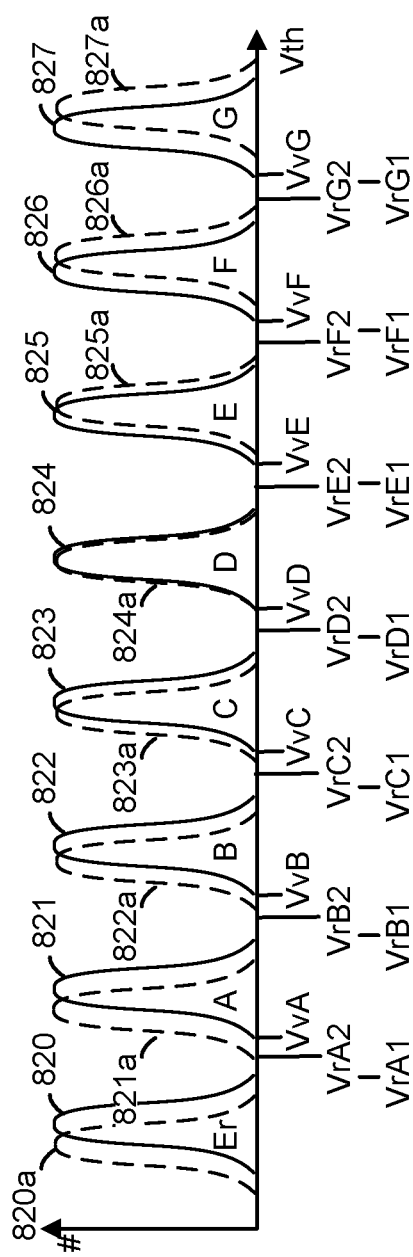

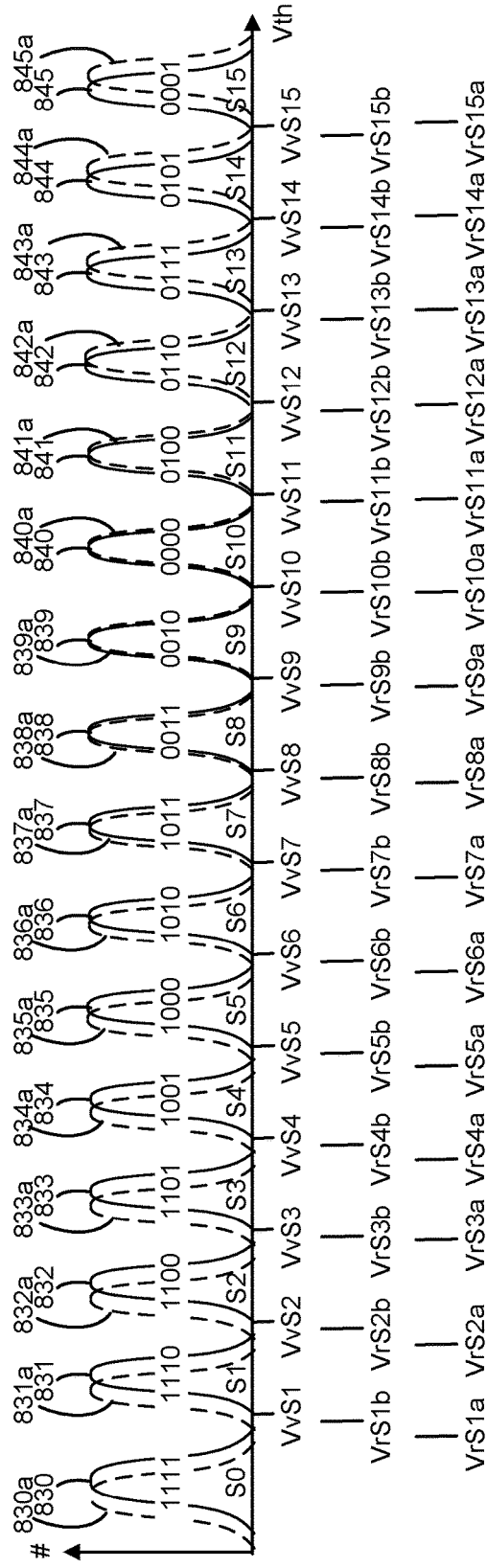

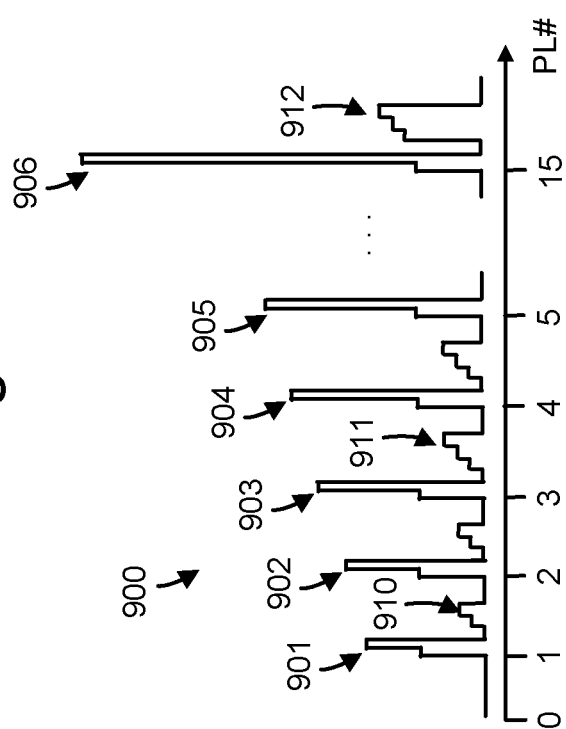

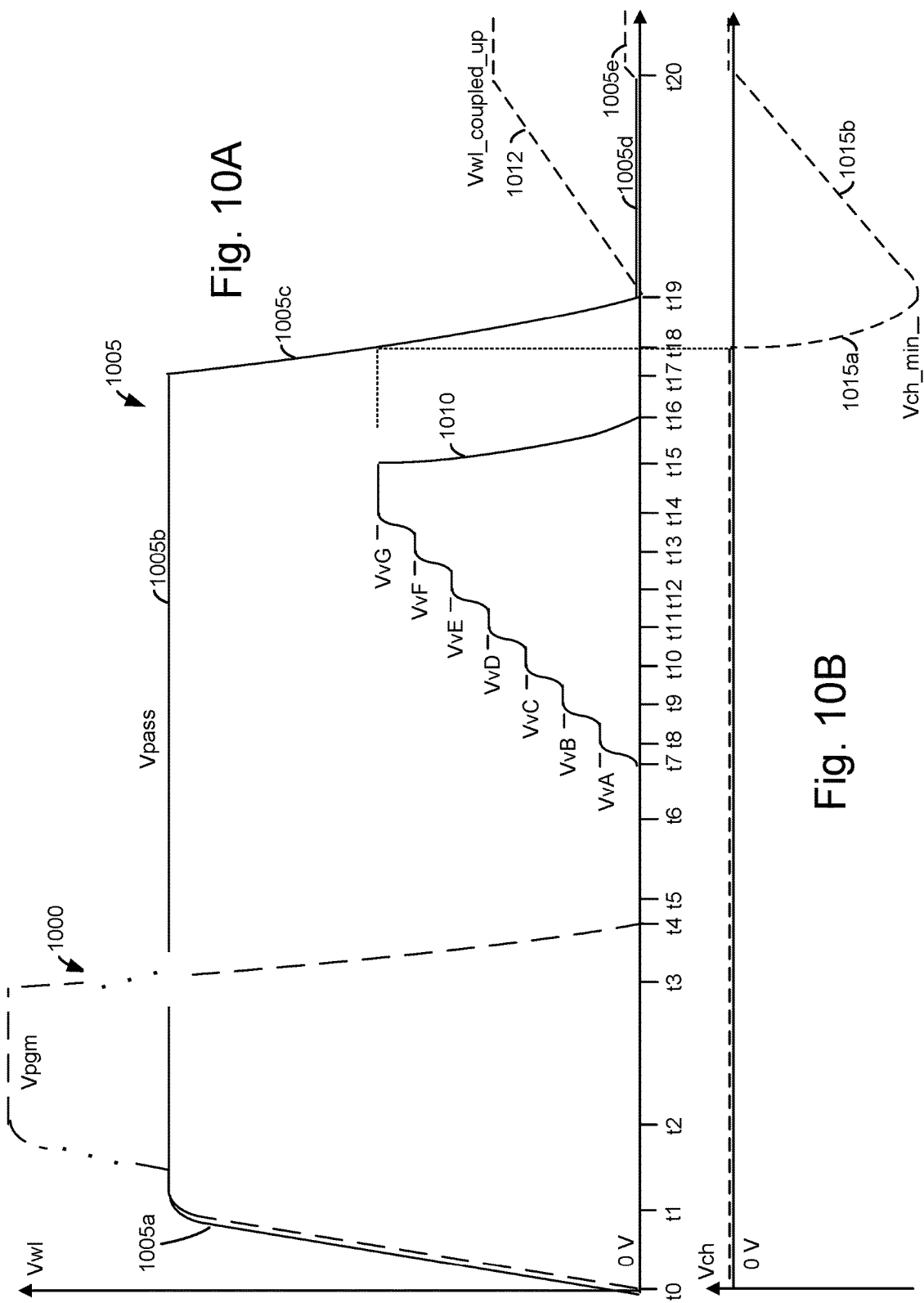

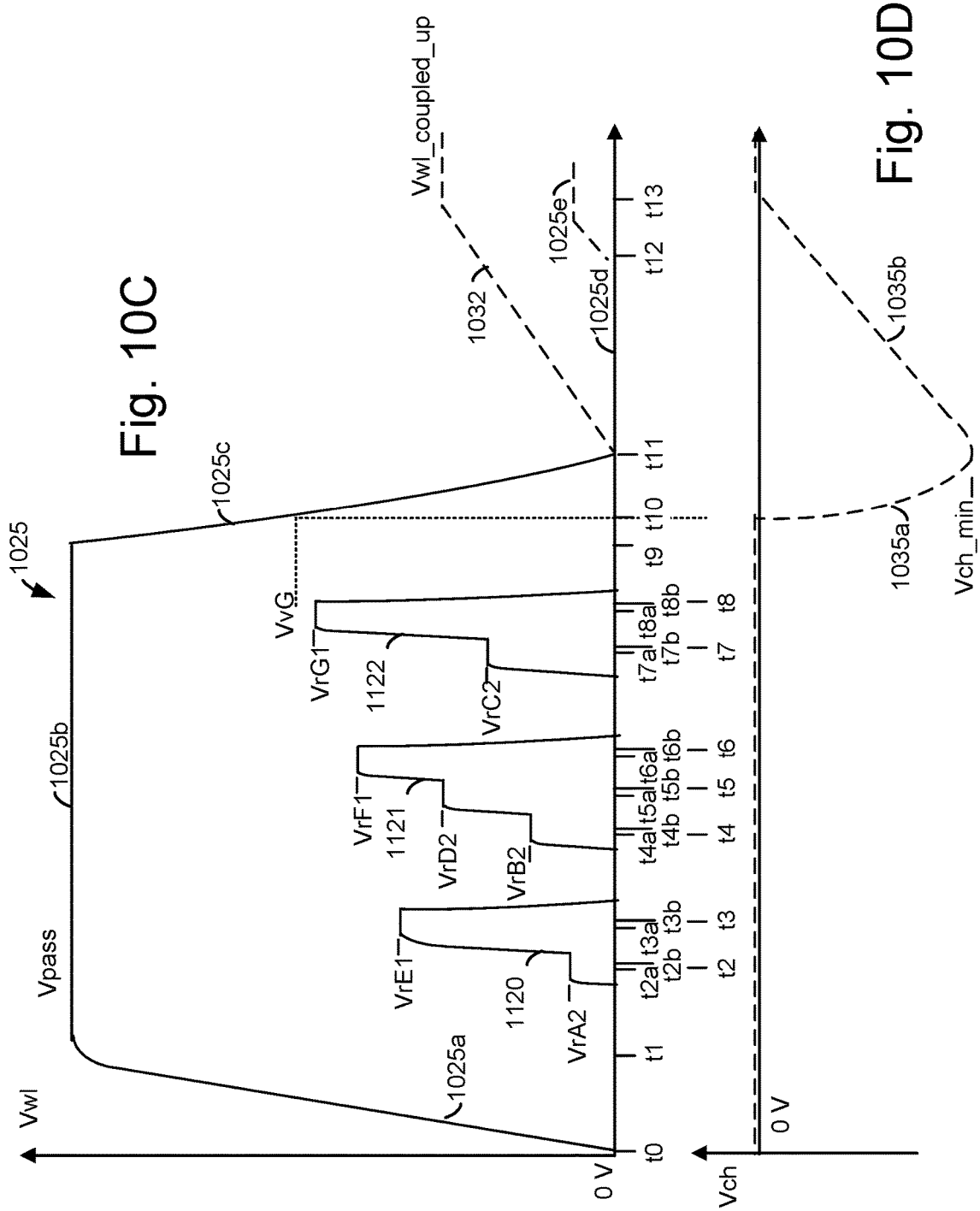

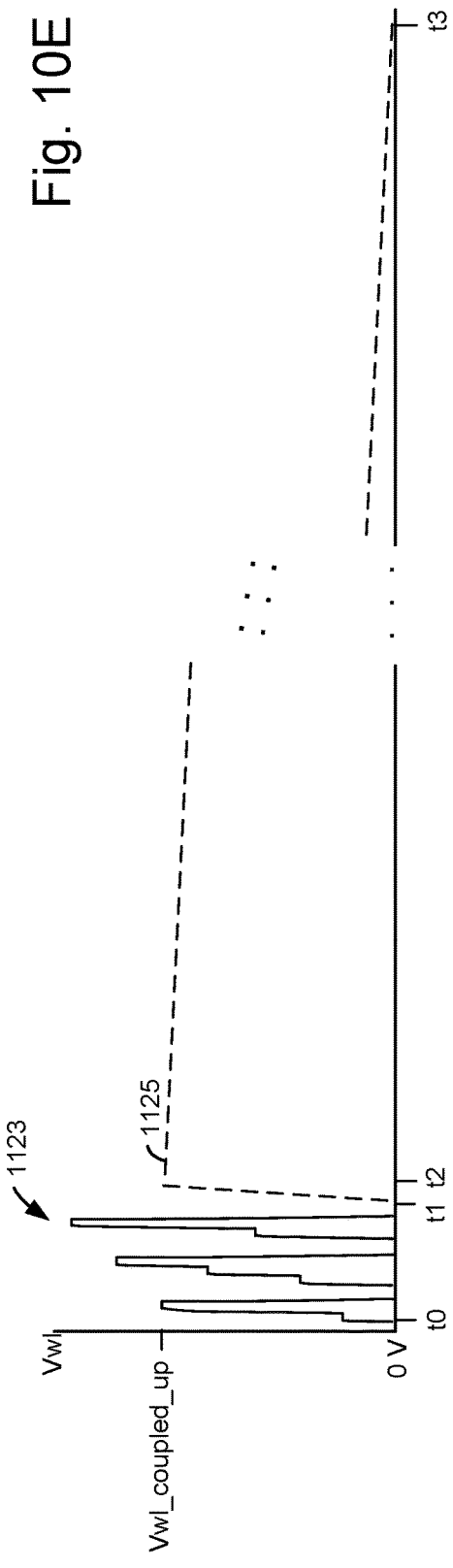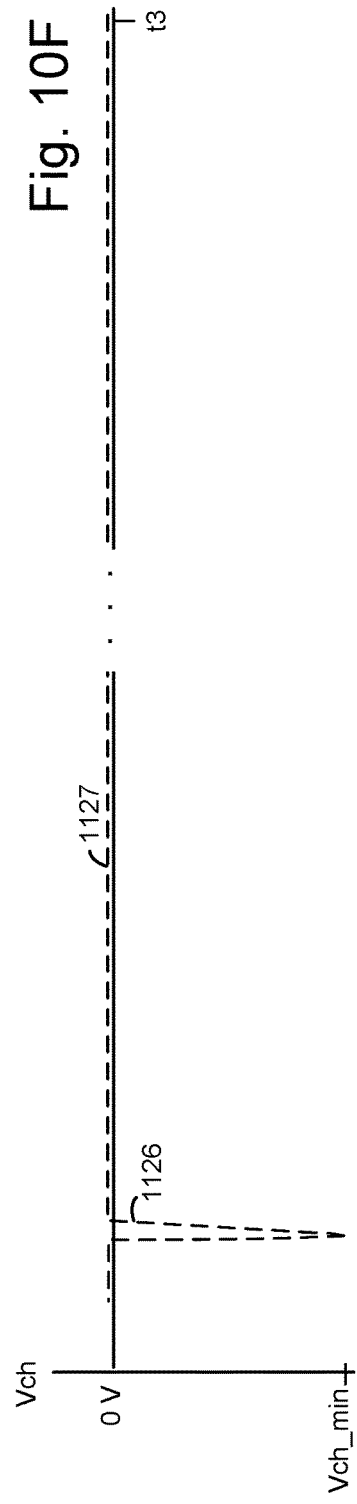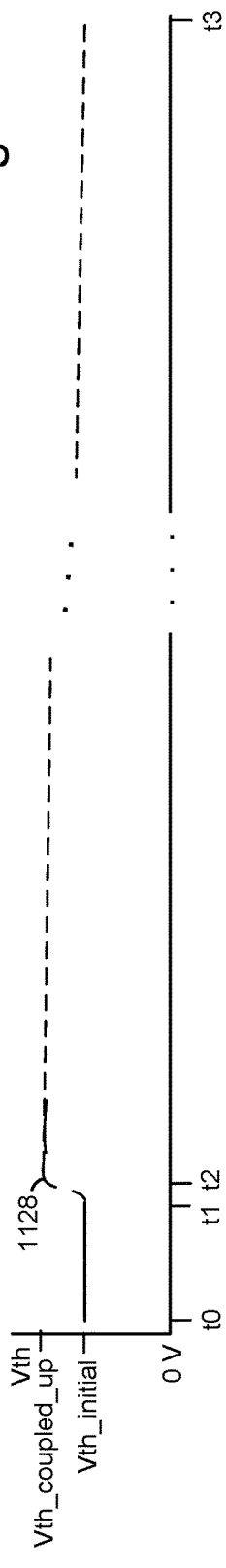

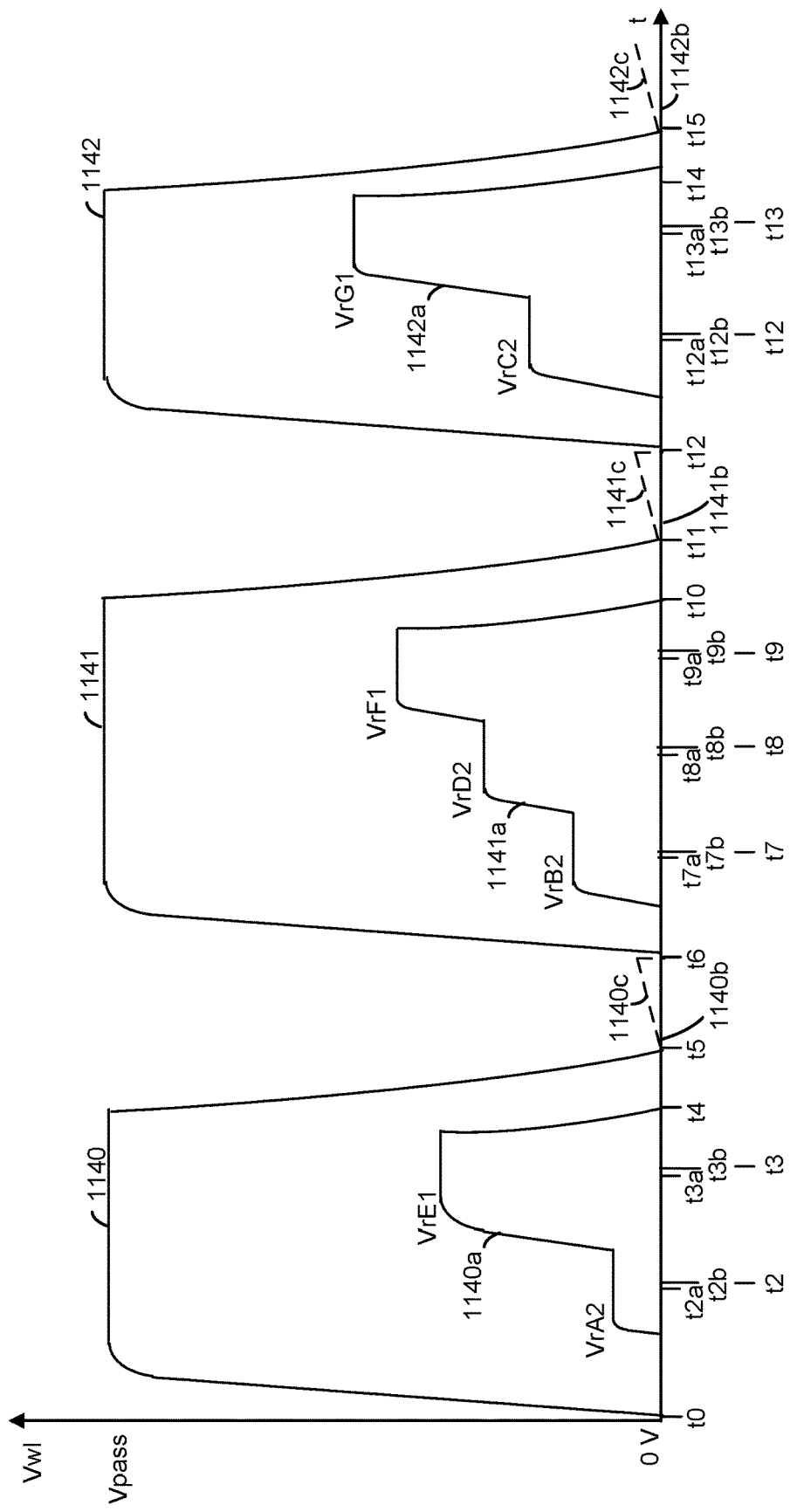
Fig. 10H1

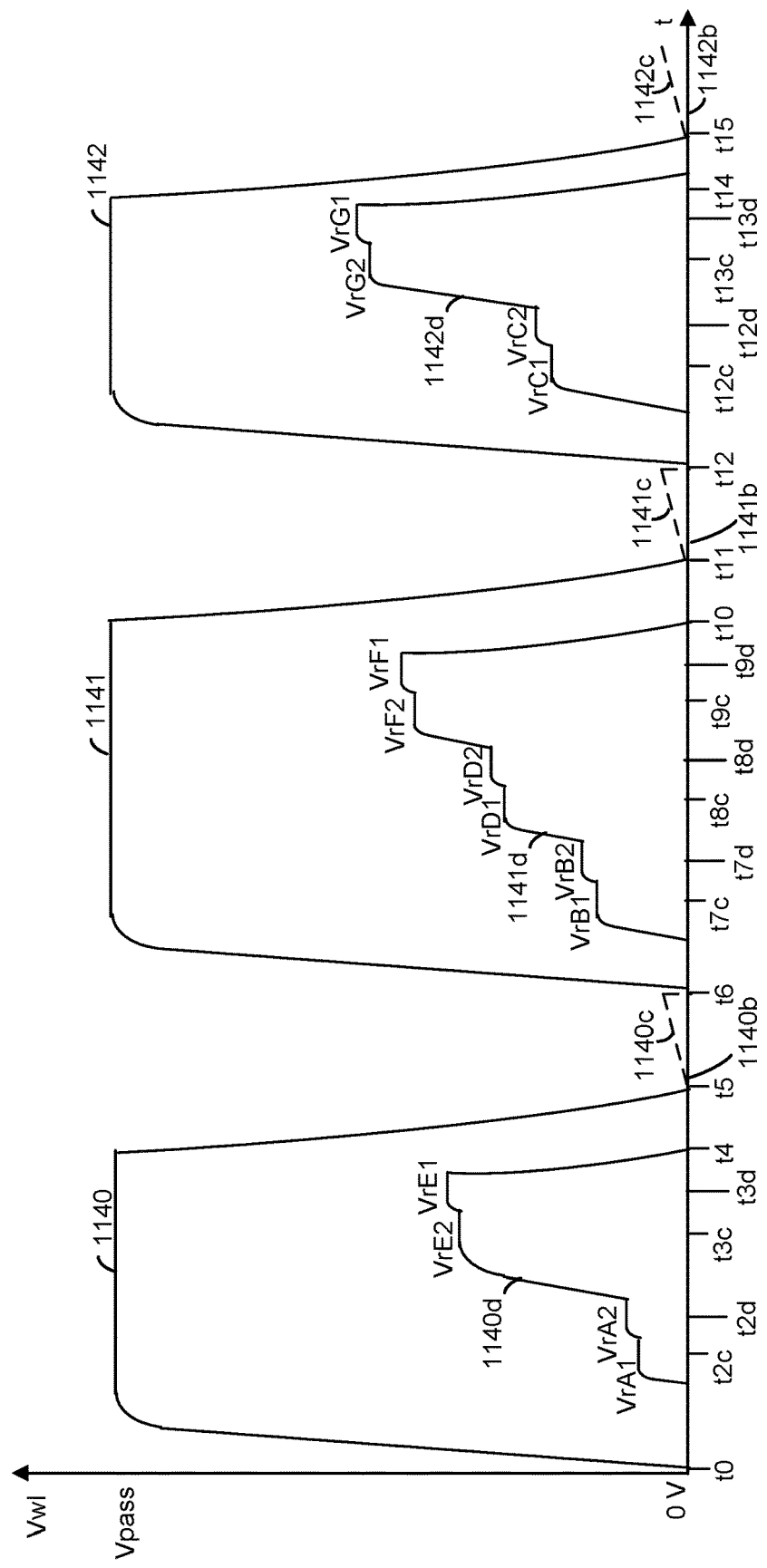
Fig. 10H2

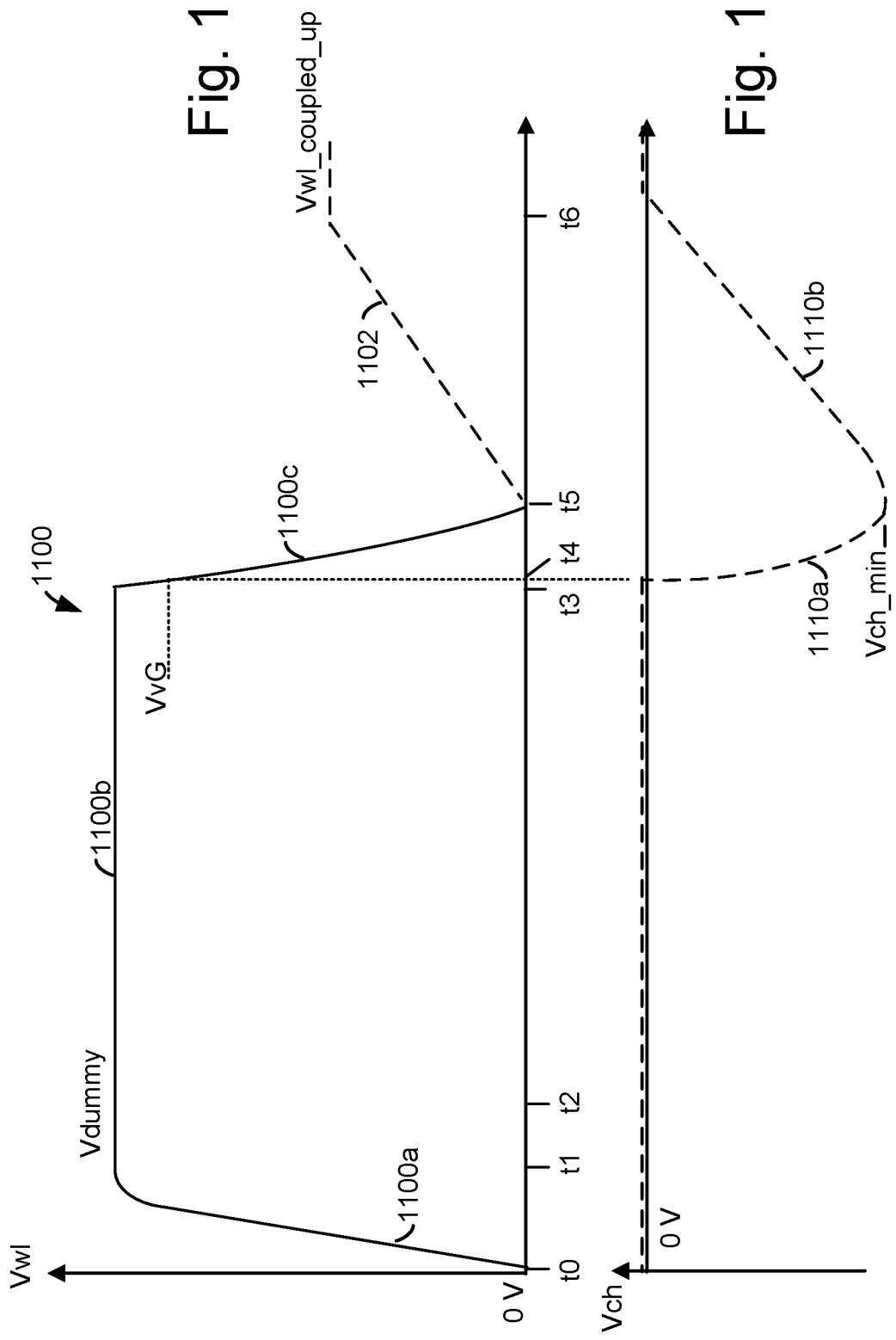

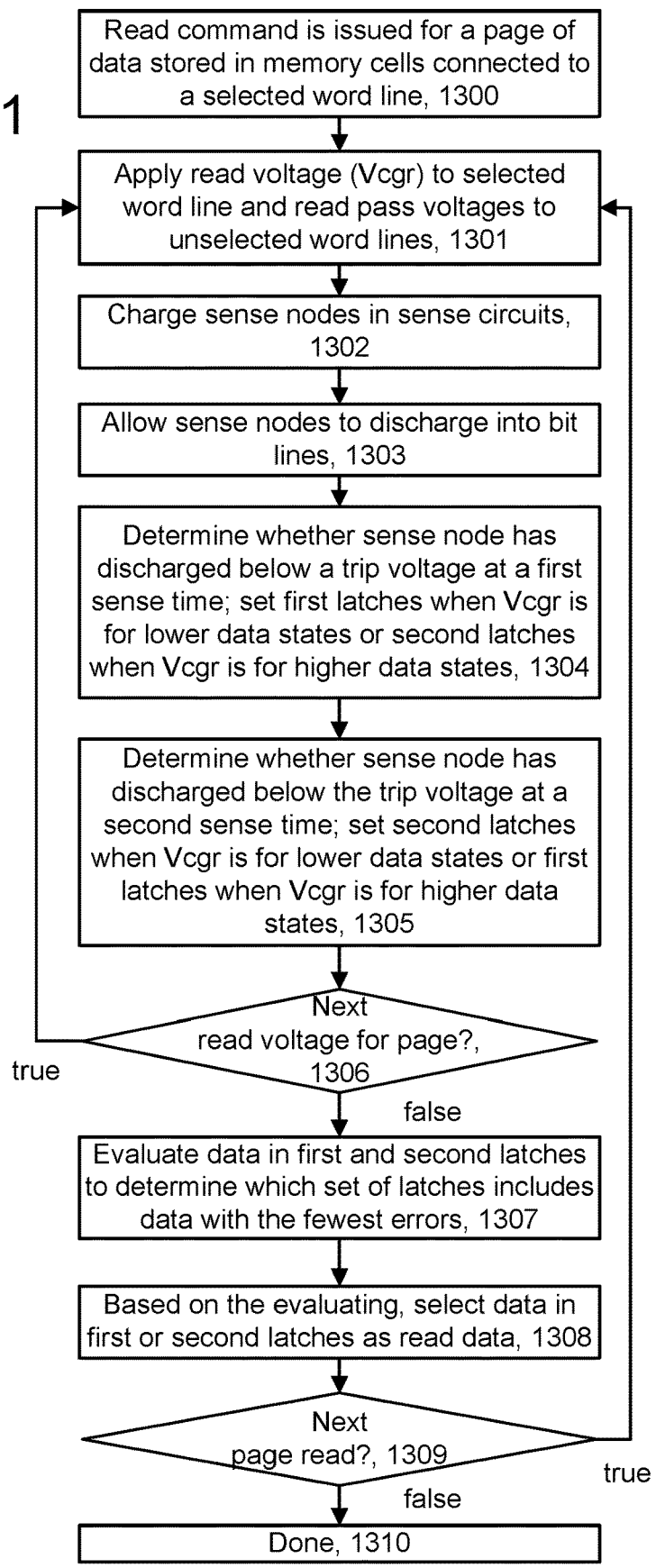
Fig. 13A1

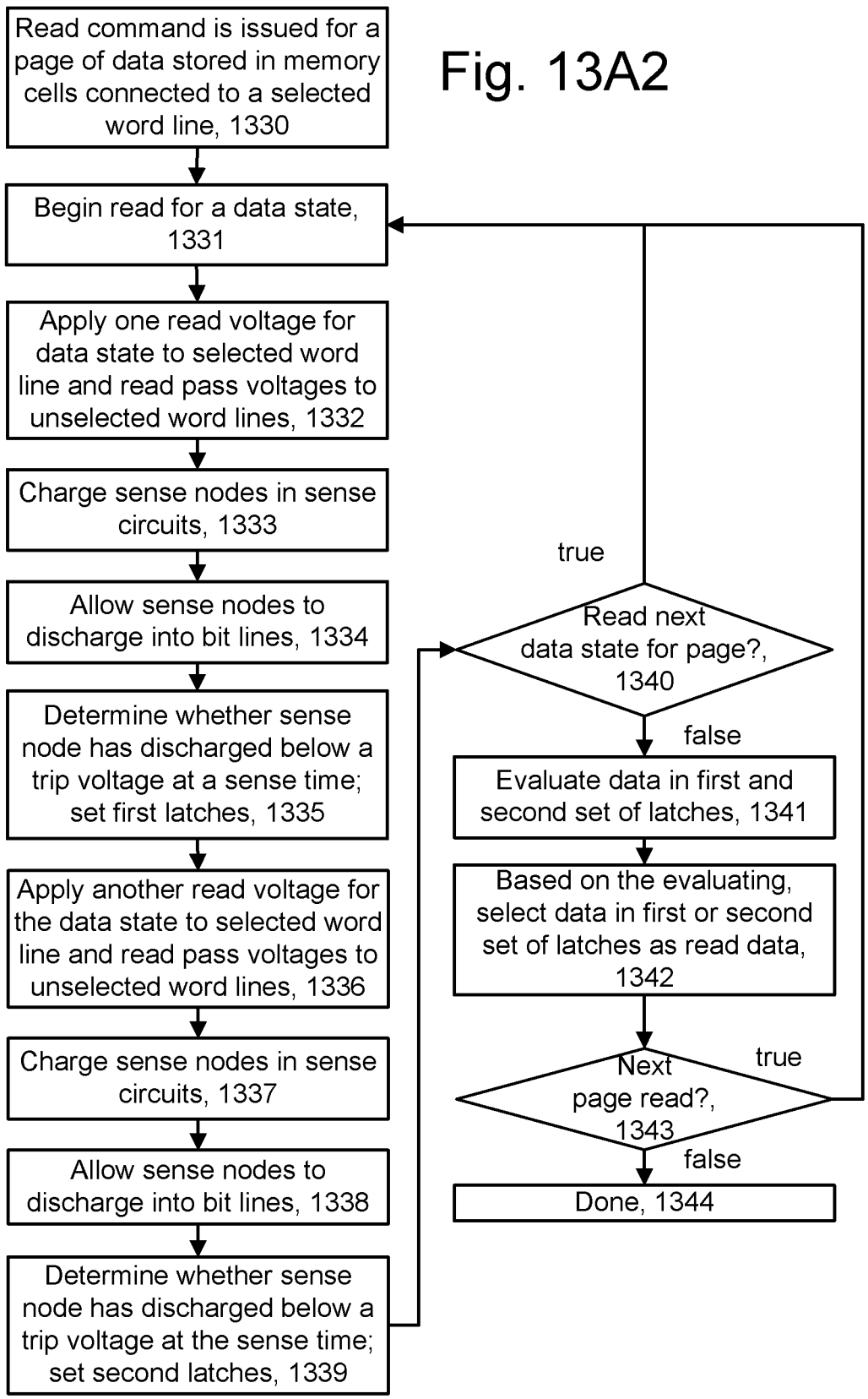
Fig. 13A2

Fig. 13B
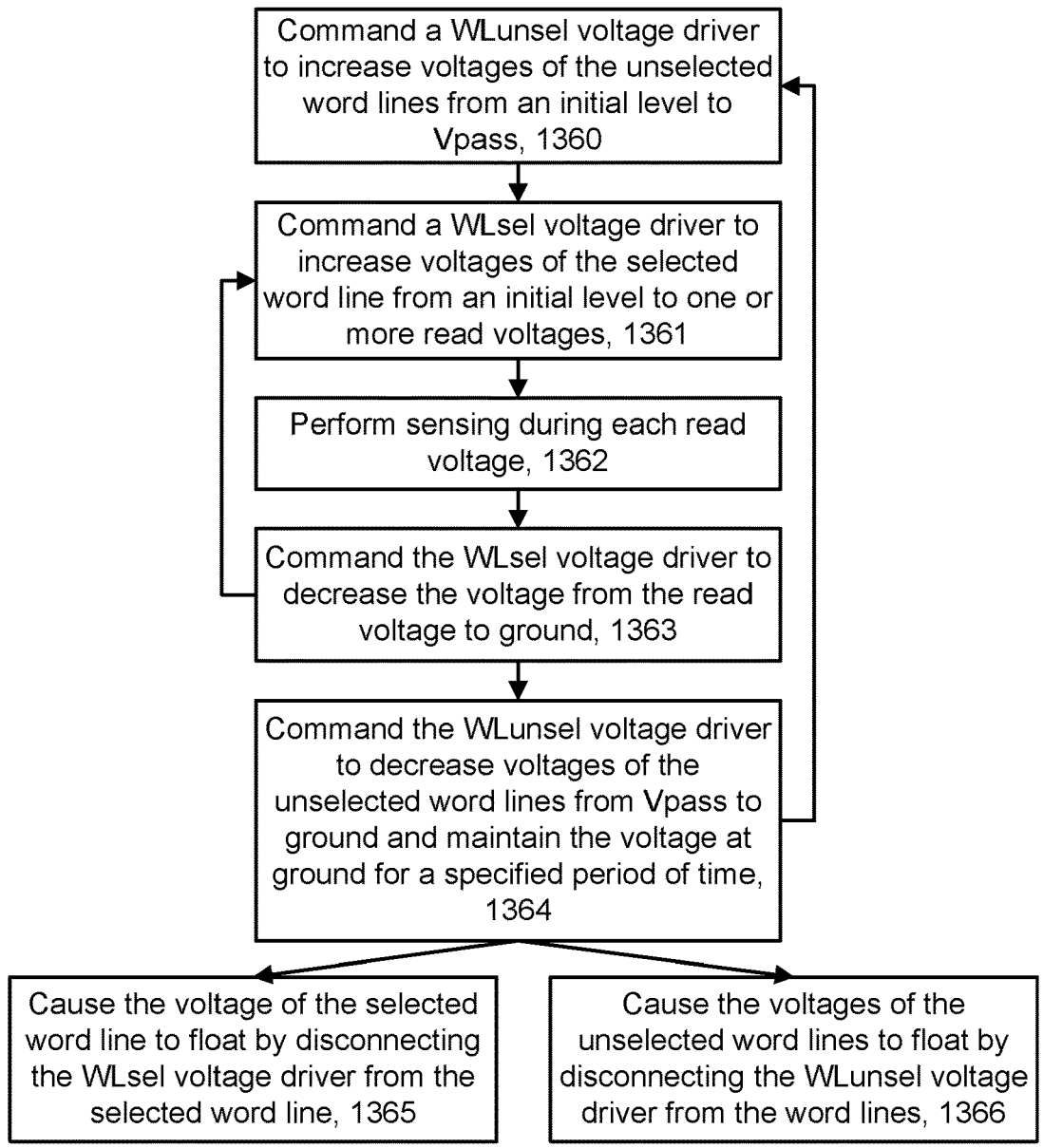
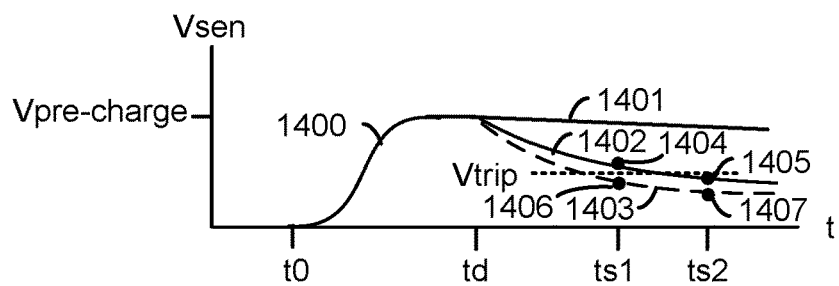
Fig. 14A

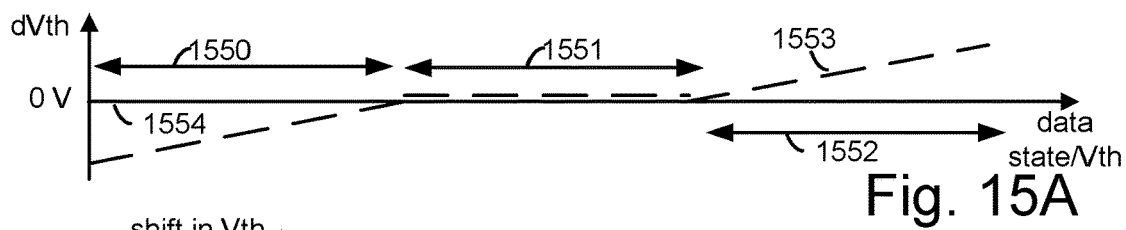
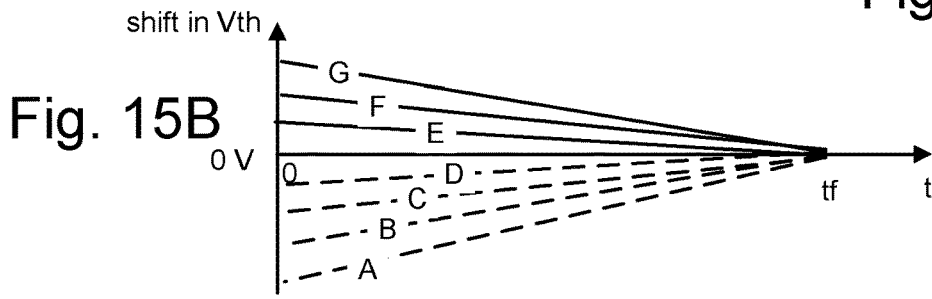
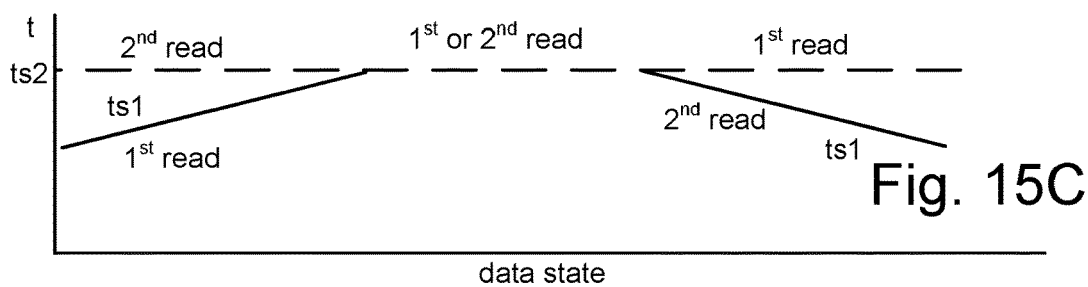
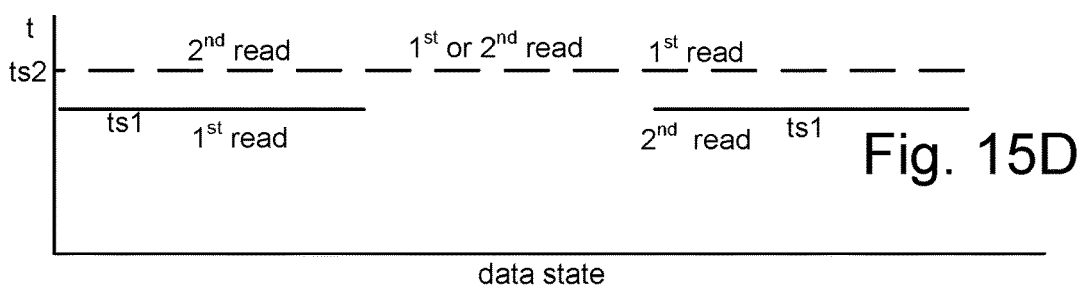
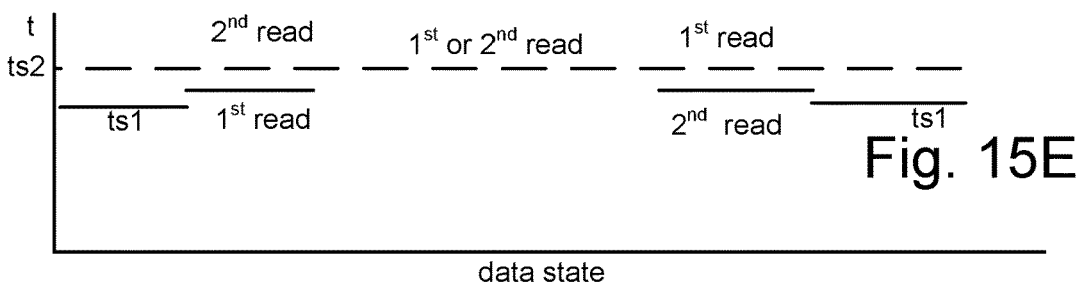
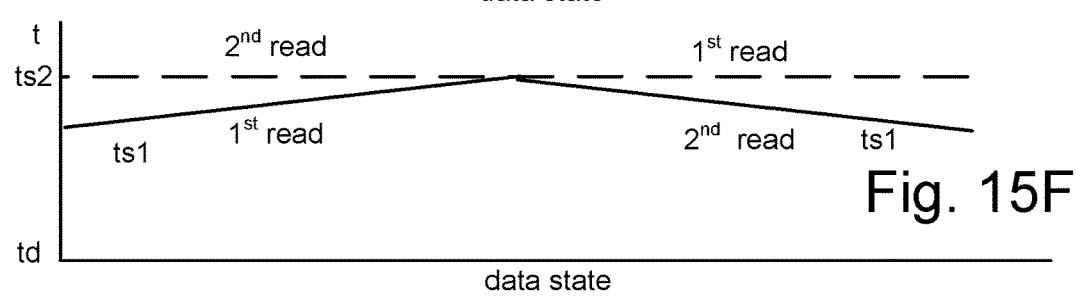

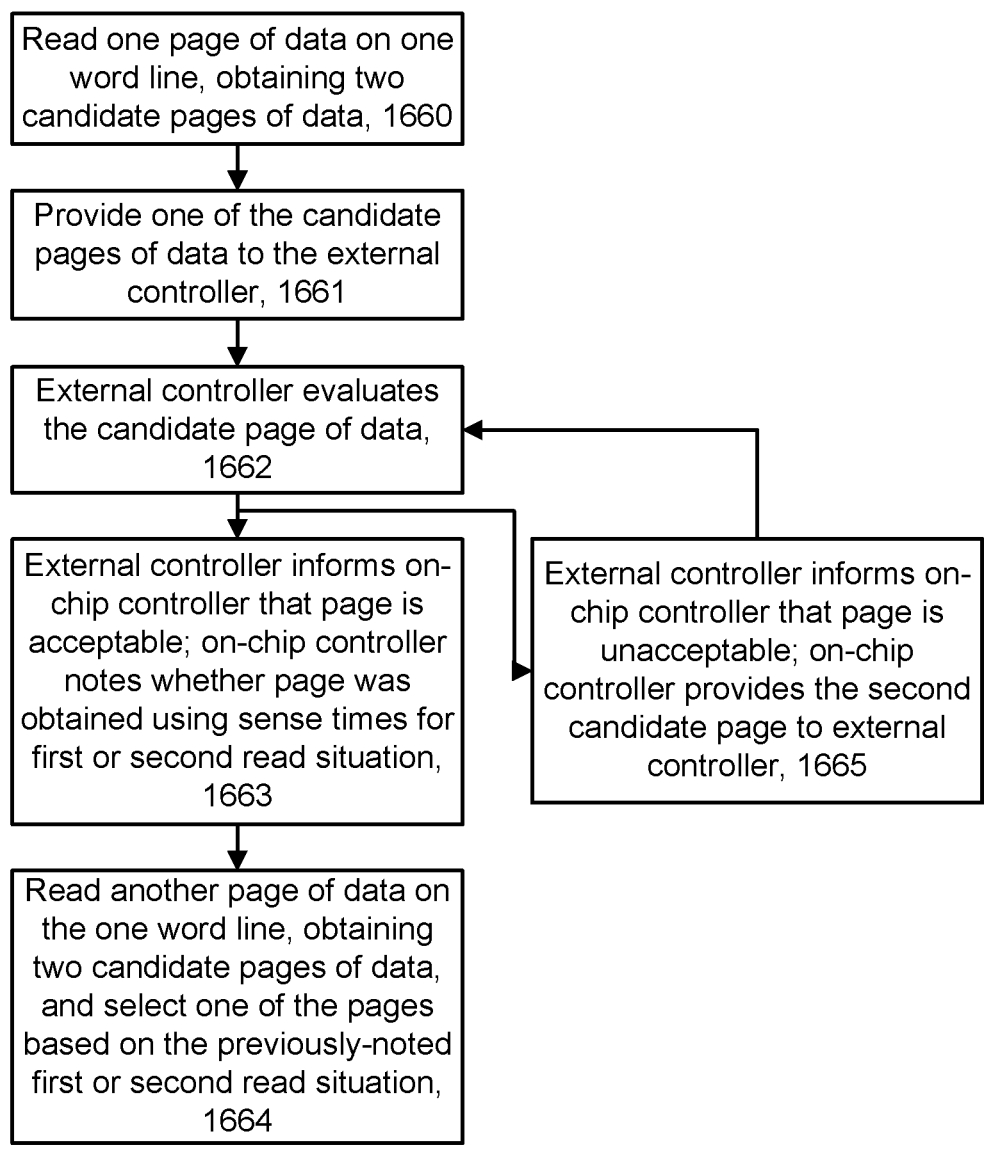

Fig. 18
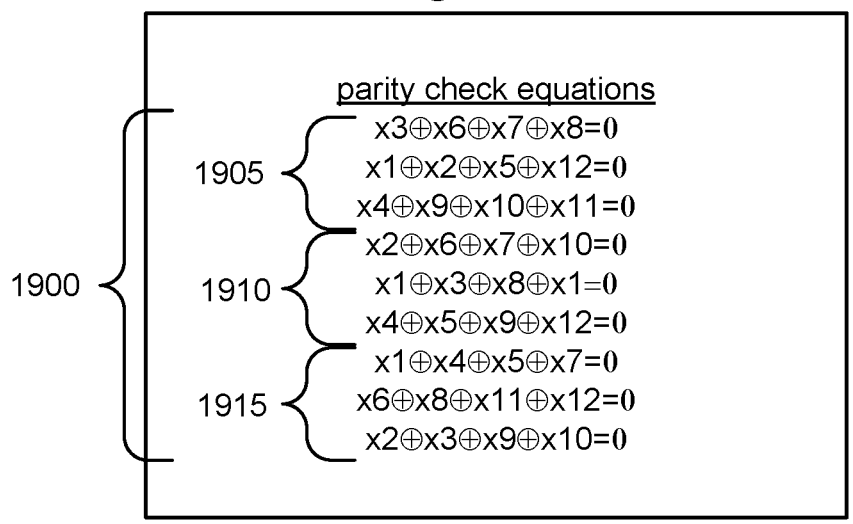
Fig. 19A
Fig. 19B
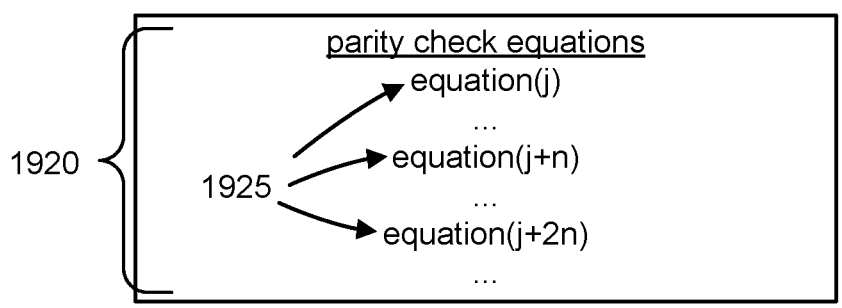

FIRST READ SOLUTION FOR MEMORY

CLAIM OF PRIORITY

This application is a divisional of U.S. patent application Ser. No. 15/333,440, filed Oct. 25, 2016, published as US 2018/0113759 on Apr. 26, 2018 and issued as U.S. Pat. No. 9,952,944 on Apr. 24, 2018, and incorporated herein by reference in its entirety.

CROSS-REFERENCE TO RELATED APPLICATIONS

The following applications are cross-referenced and incorporated by reference herein in their entireties:

U.S. patent application Ser. No. 15/440,185 entitled "Command Sequence For First Read Solution For Memory," by Alrod et al., filed Feb. 23, 2017, published as US 2018/0114580 on Apr. 26, 2018 and issued as U.S. Pat. No. 10,262,743 on Apr. 16, 2019; and U.S. patent application Ser. No. 15/921,165 entitled "First Read Solution For Memory," by Alrod et al., filed concurrently on Mar. 14, 2018 and published as US 2018/0203762 on Jul. 19, 2018.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 7 depicts an example view of NAND strings in sub-blocks in a 3D configuration which is consistent with FIG. 4.
FIG. 8A depicts an example Vth distribution of memory cells, where four data states are used, in a first read situation compared to a second read situation.
FIG. 8B depicts example bit sequences for lower and upper pages of data, and associated read voltages, for the Vth distributions of FIG. 8A.
FIG. 8C depicts an example Vth distribution of memory cells, where eight data states are used, in a first read situation compared to a second read situation.
FIG. 8D depicts example bit sequences for lower, middle and upper pages of data, and associated read voltages, for the Vth distributions of FIG. 8C.
FIG. 8E depicts an example Vth distribution of memory cells, where sixteen data states are used, in a first read situation compared to a second read situation.
FIG. 8F depicts example bit sequences for lower, lower middle, upper middle and upper pages of data, and associated read voltages, for the Vth distributions of FIG. 8E.
FIG. 9 depicts a waveform of an example programming operation.
FIG. 10A depicts a plot of example waveforms in a programming operation.
FIG. 10B depicts a plot of a channel voltage (Vch) corresponding to FIG. 10A.
FIG. 10C depicts a plot of example waveforms in a read operation, where Vpass is applied continuously with read voltages of different pages.
FIG. 10D depicts a plot of a channel voltage (Vch) corresponding to FIG. 10C.
FIG. 10E depicts the waveforms of FIG. 10C showing a decay of the coupled up voltage of the word line.
FIG. 10F depicts a plot of a channel voltage consistent with FIG. 10E.
FIG. 10G depicts a plot of a Vth of a memory cell connected to the coupled up word line, consistent with FIGS. 10E and 10F.
FIG. 10H1 depicts a plot of example waveforms in a read operation, where Vpass is applied separately during read voltages of different pages, and two sense times are used during a read voltage of a data state.
FIG. 10H2 depicts a plot of example waveforms in a read operation, where Vpass is applied separately during read voltages of different pages, and two read voltages are used for a data state.
FIG. 11A depicts a plot of an example dummy voltage of a word line and a subsequent coupled up voltage of the word line.
FIG. 11B depicts a plot of a channel voltage which is coupled down from a starting level and subsequently returns to the starting level, consistent with FIG. 11A.

FIG. 13A1 depicts an example read process for memory cells using first and second sense times in a sense circuit.

FIG. 13A2 depicts another example read process for memory cells using one sense time in a sense circuit.

FIG. 13B depicts an example read process in which word line voltages are grounded for a specified time period to reduce coupling up of the word lines, consistent with the second feature.

FIG. 14A depicts a plot of the discharging of a sense node voltage in a sense circuit at a time td and sensing at times ts1 and ts2, for cells in lower and higher data states.

FIG. 15A depicts a plot of a shift in Vth voltage versus data state or Vth, for lower, mid-range and higher data state, consistent with FIGS. 8A, 8C and 8E.

FIG. 15B depicts a plot of shift in Vth for different data states versus time.

FIG. 15C depicts a plot of sense time versus data state, where for lower and higher data states, ts1 varies according to a ramp function, and for mid-range data states, a single sense time is used.

FIG. 15D depicts a plot of sense time versus data state, where for lower and higher data states, ts1 and ts2 are fixed at different levels and for mid-range data states, a single sense time is used.

FIG. 15E depicts a plot of sense time versus data state, where for lower and higher data states, ts1 and ts2 have two levels each and for mid-range data states, a single sense time is used.

FIG. 15F depicts a plot of sense time versus data state, where ts1 varies according to a ramp function and ts2 is fixed.

FIG. 16D depicts an example process in which an external controller requests another candidate page of data if a provided page is unacceptable.

FIG. 18 depicts an example of subsets of parity check equations, consistent with FIGS. 16A and 17.

FIG. 19A depicts another example of parity check equations.

FIG. 19B depicts another example of parity check equations.

DETAILED DESCRIPTION

Figure 1A:
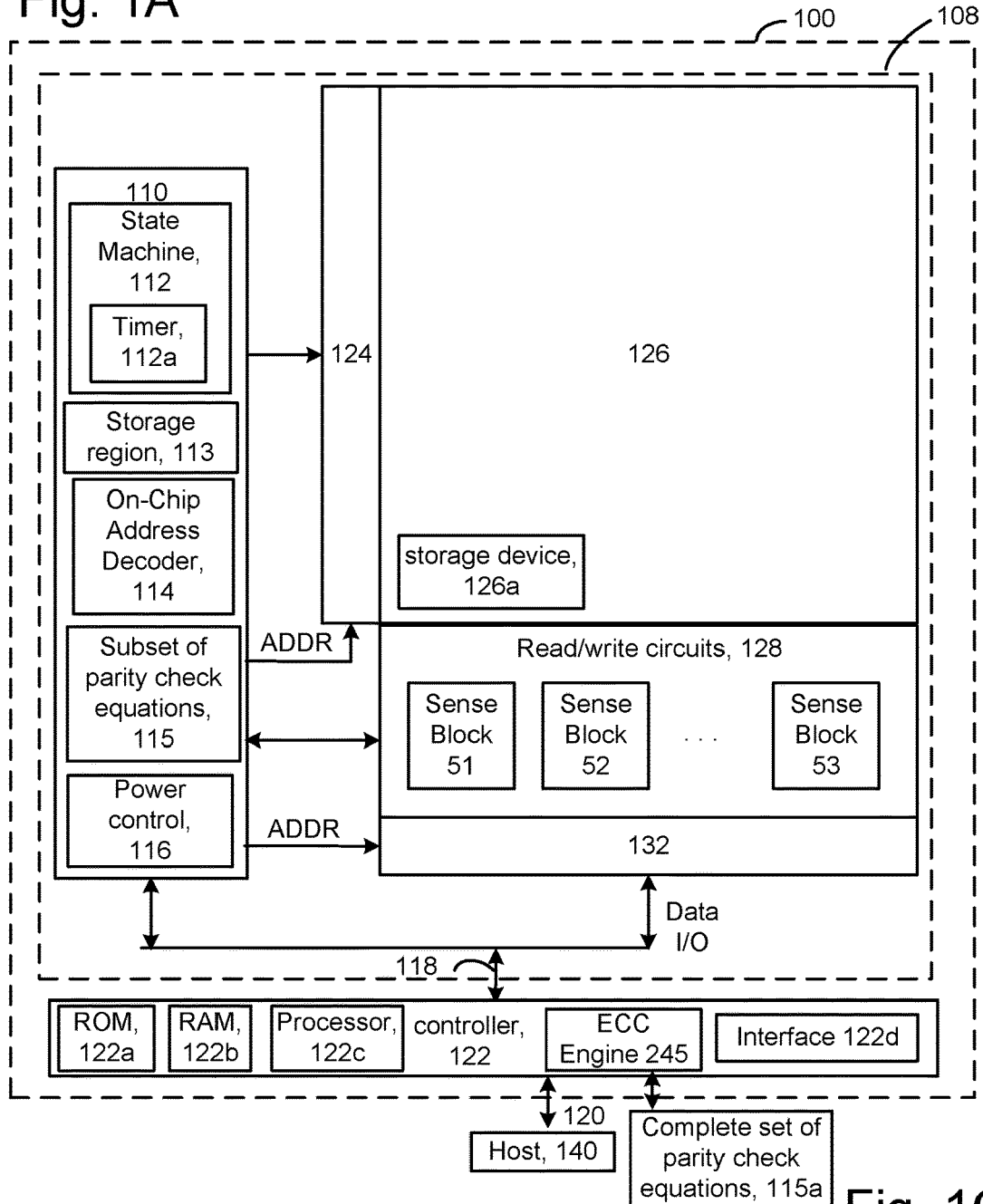
FIG. 1A is a block diagram of an example memory device.

Techniques are provided for improving the accuracy of read operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 8A). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8E) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can vary depending on when the read operation occurs. For example, the Vth can vary in the memory cells depending on a coupled up state of the word lines when the read operation occurs. A "first read" situation can be defined in which the word lines are not coupled up, and a "second read" situation can be defined in which the word lines are coupled up.

The memory cells can be in the first read situation after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read situation after a significant amount of time has passed after a last sensing operation, since the word lines discharge over time. The coupling up of the word lines causes a Vth shift in the cells due to inadvertent programming or erasing. Since the word lines are not significantly coupled up while in the first read situation, this Vth does not occur.

The cells can be in the second read situation when the read occurs shortly, e.g., seconds or minutes, after a last sensing operation. Since the word lines are relatively strongly coupled up while in the second read situation, there is a programming or erasing of the cells due to the word line voltage, and a corresponding shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there can be a weak erasing of cells which have a relatively high Vth, higher than the coupled-up voltage, e.g., cells in higher programmed data states, thus resulting in a Vth downshift for these cells.

The cells gradually transition from the second read situation to the first read situation over time, e.g., one hour, as the word lines are discharged.

The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read/verify voltage) to a selected word line. At the same time, a read pass voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. For cells in the lower data states, the Vth gradually decreases as electrons which are trapped in the charge trapping material of the cells are de-trapped and return to the channel. For cells in the higher data states, the Vth gradually increases as electrons are removed from the channel. See FIG. 10A to 12B.

When a read operation occurs, it is not known if the cells are in the first or second read situation, or perhaps somewhere in between these two situations. One approach is to track the elapsed time since a power on event or a previous sensing operation. However, this elapsed time may not accurately indicate whether the word lines are coupled up, or the extent of the coupling up, since other factors such as environmental factors and process variations may be relevant. Moreover, separate tracking of each block would be needed.

Techniques provided herein address the above and other issues. FIG. 1C depicts various features disclosed herein. A first feature includes sensing using two sense times per read voltage and selecting an optimal read result (block 10), a second feature includes grounding of word line voltages to reduce coupling up of word lines after Vpass ramp down (block 11), a third feature includes using a weak pulldown to dissipate coupling up of word line voltages (block 12) and a fourth feature includes applying a dummy word line voltage to couple up word line voltages (block 13). Another feature includes sensing using one sense time per read voltage and two read voltages per data state.

In the first feature, a sensing process occurs during the application of a read voltage to a selected word line, where two sensing times are used. See, e.g., FIG. 14A to 15F. In the sense circuits, a sense node is charged and allowed to communicate with a bit line. The amount of discharge of the sense node is sensed relative to a trip voltage at first and second sense times, and corresponding data is stored in first and second latches of the sense circuits. The storing of data into the latches can depend on the data state associated with the current sensing operation. In one approach, data from the first sense time is stored in the first latches when the read voltage is for a lower data state, or in the second latches when the read voltage is for a higher data state, and data from the second sense time is stored in the second latches when the read voltage is for a lower data state, or in the first latches when the read voltage is for a higher data state. This ensures that the first and second latches store data corresponding to the first and second read situations, respectively, in one possible implementation.

In another possible approach, data from the first and second sense times is stored in the first and second latches, respectively.

First and second pages of data are stored in the first and second latches, respectively, across the different sense circuits. The first and second pages of data are evaluated such as by determining a number of parity check equations which are met, and in response, one of the pages is selected as the read result. To save time, the evaluation may use a subset of all of the parity check equations.

The two sensing times can be optimized for the first and second read situations. As a result, when the cells are in the first read situation, the data obtained from the sensing time which is optimized for the first read situation will likely have the fewest errors and be selected. When the cells are in the second read situation, the data obtained from the sensing time which is optimized for the second read situation will likely have the fewest errors and be selected. Moreover, the sense times can be set differently for sensing of different data states, based on the expected amount of Vth shift. When the expected amount of Vth shift is relatively small, the difference between the two sense times can also be relatively small. In some cases, a single sense time can be used, such as for reading of a mid-range data state. The concept can be extended to more than two sense times per read voltage as well.

Further, this feature can be used for any read operation in general. The Vth of memory cells can shift due to various factors such as data retention loss, environmental factors (e.g., temperature), process variations and so forth.

In the second feature, the cells are kept in, or close to, the first read situation by preventing or reducing coupling up of the word lines. This approach can include grounding the word line voltages after the step down of the pass voltages for a time period. See, e.g., FIG. 24. The time period can be long enough to limit the coupling up of the channel. After the time period, the word line voltages can be floated to save power.

In the third feature, the cells are kept in, or close to, the first read situation by connecting a weak pulldown circuit to the word lines. See, e.g., FIG. 24. This causes a gradual dissipation of the coupled up voltage of the word lines.

In the fourth feature, the cells are kept in, or close to, the second read situation by applying a dummy read voltage to the word lines periodically, e.g., once every second or other time period, in response to a read command, or at other times. See, e.g., FIG. 11A to 11C. After the dummy read voltage is ramped down, the word line voltages are floated higher due to a coupling up from the channel, so that the second read situation occurs.

The various features for keeping the cells in, or close to, the first or second read situation, can be combined with the feature for using two sense times per read voltage and selecting an optimal read result.

Various other features and benefits are described below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a subset of parity check equations 115 (a subset of the complete set of parity check equations 115a), and a power control module 116. The state machine 112 provides chip-level control of memory operations. The state machine may include a clock 112a to determine an elapsed time since a last sensing operation, as discussed further below. A storage region 113 may be provided, e.g., for read voltage shifts, as described further below. Generally, the storage region may store operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 24. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors and can include a complete set of parity check equations 115a.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
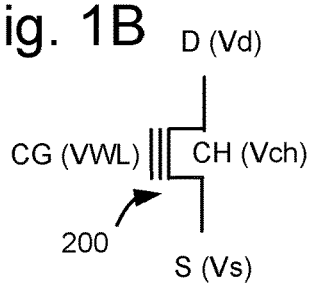
FIG. 1B depicts an example memory cell 200.
Figure 1C:
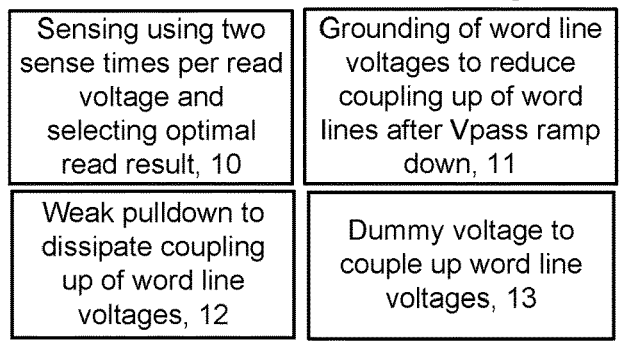
FIG. 1C depicts various features disclosed herein.

FIG. 1B depicts an example memory cell 200. The memory cell comprises a control gate CG which receives a word line voltage Vwl, a drain at a voltage Vd, a source at a voltage Vs and a channel at a voltage Vch.

Figure 2:
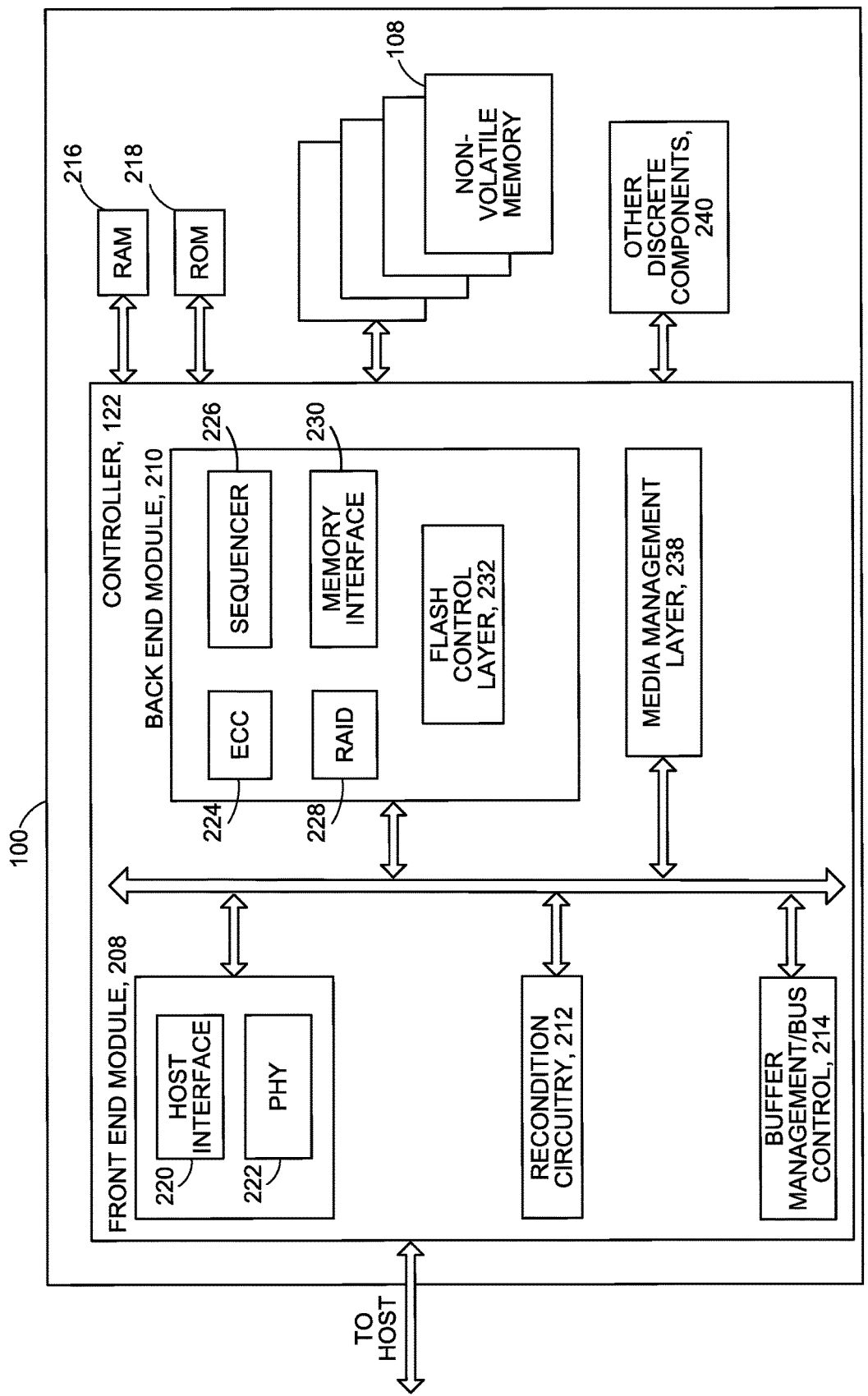
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
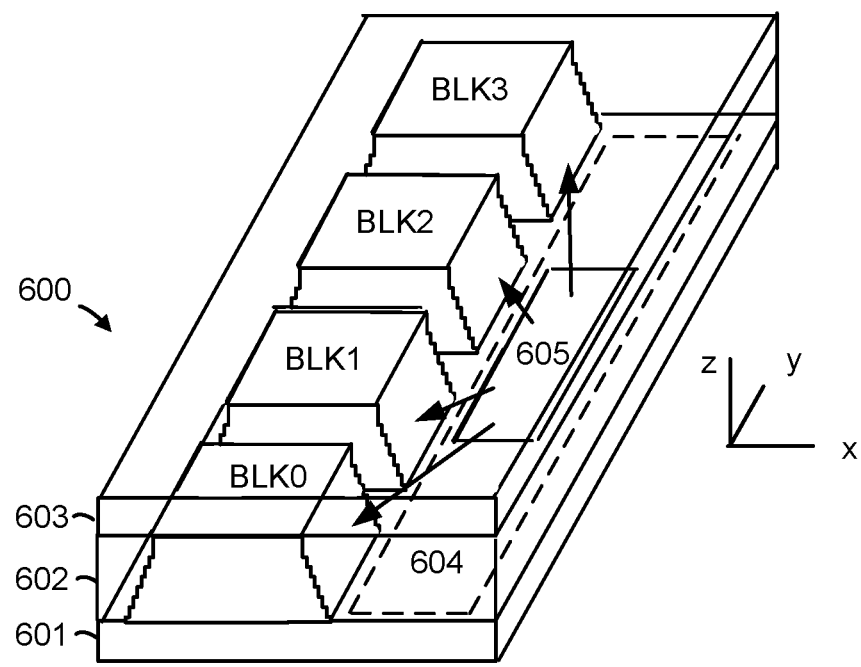
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
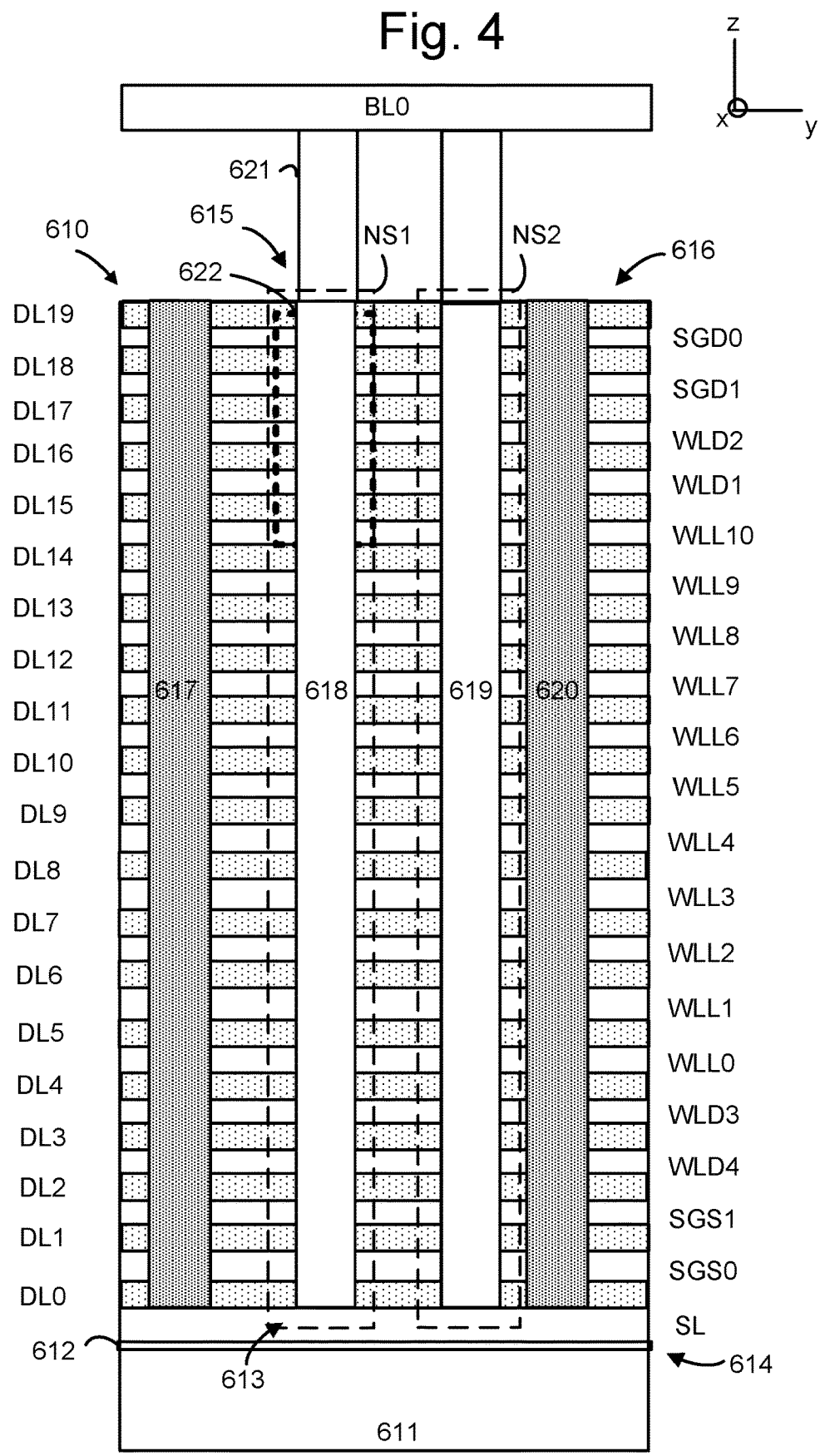
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
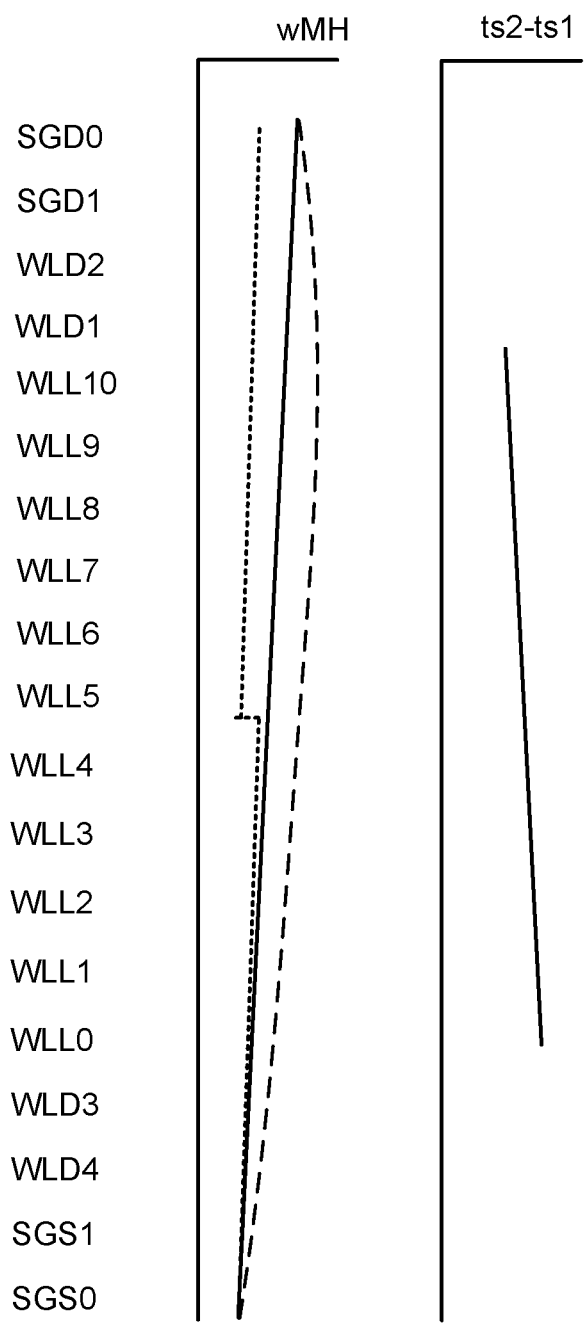
FIG. 5A depicts a plot of memory hole diameter in the stack of FIG. 4.
FIG. 5B depicts a plot of a difference between sense times for a word line based on memory hole/pillar diameter, consistent with FIG. 5A.

FIG. 5A depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5A). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5A). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes. The amount of word line coupling up and discharge is therefore relatively larger than for memory cells in word lines adjacent to the relatively larger diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

FIG. 5B depicts a plot of a difference between sense times (ts2−ts1, see also FIG. 14A to 15F) for a word line based on memory hole/pillar diameter, consistent with FIG. 5A. A relatively larger amount of coupling up can correspond to a relatively large difference in the Vth of lower state cells as depicted in FIGS. 8A, 8C and 8E, for the first read situation compared to the second read situation. The difference in the sense times for the lower states can therefore also be made relatively larger.

In one approach, the set of word lines comprises conductive layers separated by dielectric layers in a stack, the set of memory cells are arranged along vertical pillars in the stack, diameters of the vertical pillars vary with a height in the stack, and the control circuit is configured to set a difference between the first and second times as a function of the height of the selected word line in the stack (a function of the pillar diameter), at least for lower data states among a plurality of data states. The difference in the sense times can be made relatively larger when the selected word line is adjacent to a relatively smaller diameter portion of the pillar.

The difference between the first and second times can vary as a function of the height of the selected word line in the stack, for other data states as well such as the higher data states among the plurality of data states.

Figure 6:
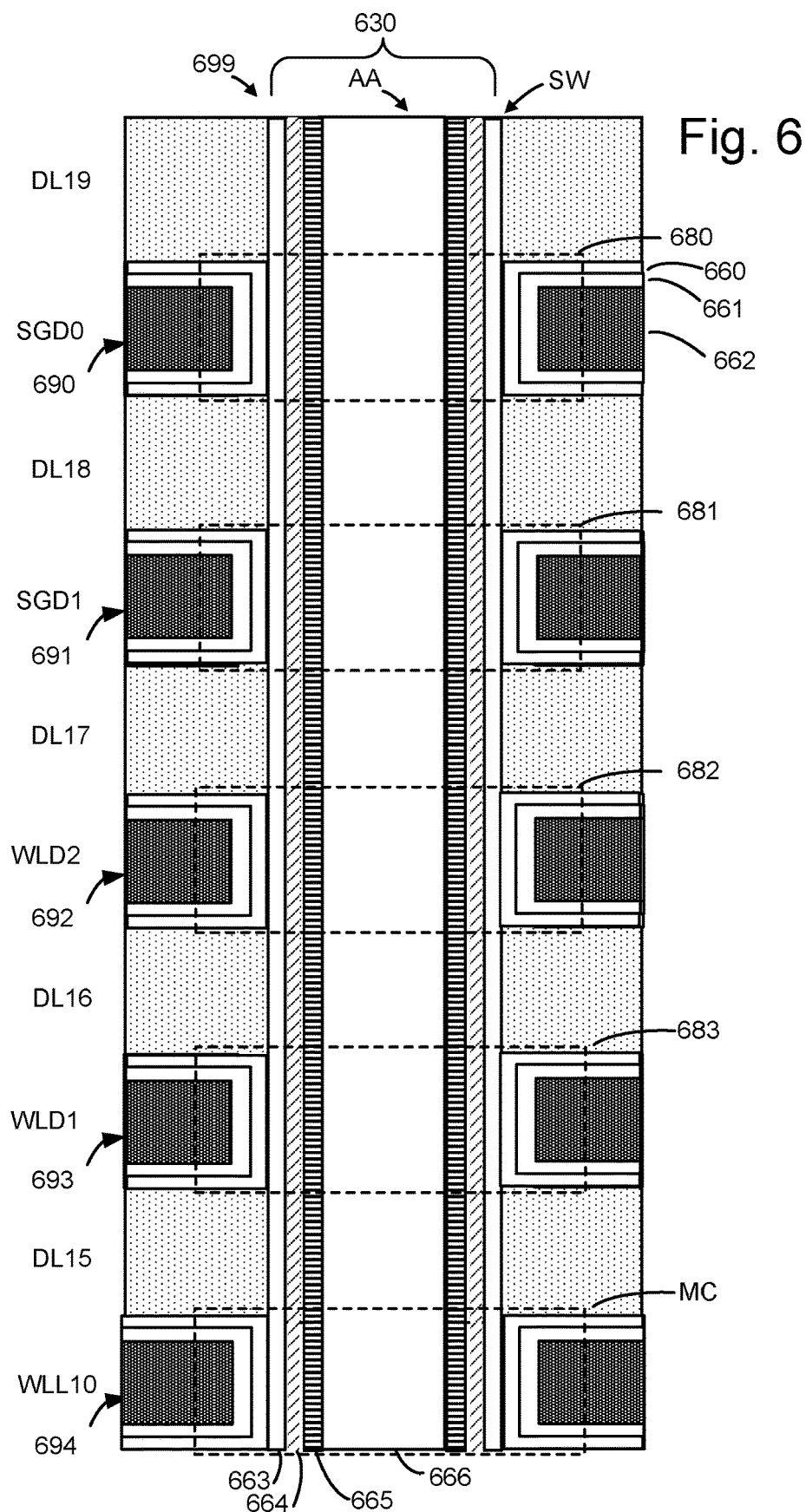
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. See FIG. 9. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

FIG. 8A depicts an example Vth distribution of memory cells, where four data states are used, in a first read situation compared to a second read situation. The data states are represented by Vth distributions 810, 811, 812 and 813 for the Er (erased), A, B and C states, respectively, in the second read situation, and by the Vth distributions 810a, 811a, 812a and 813a, respectively, in the first read situation. In some cases, as shown, the lower states have a lower Vth in the first read situation compared to the second read situation, while the higher states have a higher Vth in the first read situation compared to the second read situation. The mid-range states, which are between the lower states and the higher states, may have a same, or nearly the same, Vth in the first and second read situations.

In other cases, the mid-range and higher states may have a same Vth in the first and second read situations. For example, since a read operation for a page typically applies a read voltage for a lower state followed by a read voltage for a higher state, the cells of the higher states can be affected by the read of the lower states, and can transition toward the second read situation, such that the Vth upshift depicted in FIG. 8A is reduced.

The optimum read voltages generally are midway between the Vth distributions of adjacent data states. Accordingly, as the Vth distribution shifts, the optimum read voltages shift. For the second read situation, the optimum read voltages for the A, B and C states are VrA2, VrB2 and VrC2, respectively. For the first read situation, the optimum read voltages for the A, B and C states are VrA1, VrB1 and VrC1, respectively, where VrA2>VrA1, VrB2>VrB1 and VrC2<VrC1. During a programming operation, the verify voltages are VvA, VvB and VvC.

Each read voltage demarcates a lower boundary of a data state of a plurality of data states. For example, VrA1 or VrA2 demarcate a lower boundary of the A state.

The optimum read voltages are therefore different for the first read situation compared to the second read situation. As mentioned, a first feature described herein performs a read operation using one set of read voltages without knowing whether the first or second read situation is present. By using two sense times per read voltage in the sense circuit, and selecting a read result from one of the sense times, the effect is similar to using two sets of read voltages as shown but without the penalty of extending the time of the read operation. However, using two sets of read voltages (two read voltages per data state) is also an option.

Referring still to FIG. 8A, the Vth distributions 810, 811, 812 and 813 would be seen if the distributions are taken right after programming, in the second read situation. If we wait for a while, e.g., one hour, the Vth distributions 810a, 811a, 812a and 813a would be obtained, in the first read situation. If we take another distribution after a read operation, the Vth distributions 810, 811, 812 and 813 would be seen again. The read voltages may be optimized for the second read situation so that a number of read errors would be increased if the cells are in the first read situation, and a fixed sensing time was used.

The first read situation can occur when there is a long delay since a last programming or read operation. An example sequence is: program a block, wait for one hour, then read the block. The first read situation can also occur when there is a power down/power up. An example sequence is: program a block, power down/power up, then read the block. The first read situation can also occur when there is a program or read of other blocks. An example sequence is: program one block, program another block, then read the one block.

FIG. 8B depicts example bit sequences for lower and upper pages of data, and associated read voltages, for the Vth distributions of FIG. 8A. An example encoding of bits for each state is 11, 10, 00 and 01, respectively, in the format of upper page (UP) bit/lower page (LP) bit. A LP read may use VrA and VrC and an UP read may use VrB. A lower or upper bit can represent data of a lower or upper page, respectively. Three programmed data states A, B and C are used in addition to the erased state, Er. With these bit sequences, the data of the lower page can be determined by reading the memory cells using read voltages of VrA and VrC. The lower page (LP) bit=1 if Vth<=VrA or Vth>VrC. LP=0 if VrA<Vth<=VrC. The upper page (UP) bit=1 if Vth<=VrB and LP=0 if Vth>VrB. In this case, the UP is an example of a page which can be determined by reading using one read voltage applied to a selected word line. The UP is an example of a page which can be determined by reading using two read voltages applied to a selected word line. The read voltages are depicted as VrA, VrB and VrC, where each of these can represent the first or second read values, whichever is optimal.

FIG. 8C depicts an example Vth distribution of memory cells, where eight data states are used, in a first read situation compared to a second read situation. For the Er, A, B, C, D, E, F and G states, we have Vth distributions 820, 821, 822, 823, 824, 825, 826 and 827, respectively, in the second read situation, and 820a, 821a, 822a, 823a, 824a, 825a, 826a and 827a, respectively, in the first read situation. For the A, B, C, D, E, F and G states, we have verify voltages VvA, VvB, VvC, VvD, VvE, VvF and VvG, respectively, read voltages VrA2, VrB2, VrC2, VrD2, VrE2, VrF2 and VrG2, respectively, in the second read situation, read voltages VrA1, VrB1, VrC1, VrD1, VrE1, VrF1 and VrG1, respectively, in the first read situation, and example encoding of bits of 111, 110, 100, 000, 010, 011, 001 and 101, respectively. The bit format is: UP/MP/LP.

This example indicates the shift in the Vth distribution for the first read situation compared to the second read situation is relatively larger when the data state is relatively lower or higher, than when the data state is mid-range. The shift may be progressively larger for progressively lower or higher data states. In one example, the read voltages of VrA1, VrB1, VrC1 and VrD1 are optimal for the relatively lower states of A, B, C and D, respectively, and the read voltages of VrE1, VrF1 and VrG1 are optimal for the relatively higher states of E, F and G, respectively, in the first read situation. Similarly, the read voltages of VrA2, VrB2, VrC2 and VrD2 are optimal for the relatively lower states of A, B, C and D, respectively, and the read voltages of VrE2, VrF2 and VrG2 are optimal for the relatively higher states of E, F and G, respectively, in the second read situation. Furthermore, VrA1<VrA2, VrB1<VrB2, VrC1<VrC2, VrD1<VrD2, VrE1>VrE2, VrF1>VrF2 and VrG1>VrG2. Thus, the lower of two read voltages per state is optimal in the first read situation for the lower states and the higher of two read voltages per state is optimal in the first read situation for the higher states, in one possible implementation.

FIG. 8D depicts example bit sequences for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

The read voltages are depicted as VrA, VrB, VrC, VrD, VrE, VrF and VrG, where each of these can represent the first or second read values, whichever is optimal.

FIG. 8E depicts an example Vth distribution of memory cells, where sixteen data states are used, in a first read situation compared to a second read situation. Programming using four bits per cell (16 levels) can involve lower, lower-middle, upper-middle and upper pages. The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, in the first read situation, by Vth distributions 830a, 831a, 832a, 833a, 834a, 835a, 836a, 837a, 838a, 839a, 840a, 841a, 842a, 843a, 844a and 845a, respectively, in the second read situation, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted in FIG. 8E and FIG. 8F. The verify voltages are VvS1, VvS2, VvS3, VvS4, VvS5, VvS6, VvS7, VvS8, VvS9, VvS10, VvS11, VvS12, VvS13, VvS4 and VvS15. The optimum read voltages are VrS1b, VrS2b, VrS3b, VrS4b, VrS5b, VrS6b, VrS7b, VrS8b, VrS9b, VrS10b, VrS11b, VrS12b, VrS13b, VrS14b and VrS15b in the second read situation and VrS1a, VrS2a, VrS3a, VrS4a, VrS5a, VrS6a, VrS7a, VrS8a, VrS9a, VrS10a, VrS11a, VrS12a, VrS13a, VrS14a and VrS15a in the first read situation for states S1, S2, S3, S4, S5, S6, S7, S8, S9, S10, S11, S12, S13, S14 and S15, respectively.

FIG. 8F depicts example bit sequences for lower, lower middle, upper middle and upper pages of data, and associated read voltages, for the Vth distributions of FIG. 8E. A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8. The read voltages are depicted as VrS1, VrS2, VrS3, VrS4, VrS5, VrS6, VrS7, VrS8, VrS9, VrS10, VrS11, VrS12, VrS13, VrS4 and VrS15, where each of these can represent the first or second read values, whichever is optimal.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 10A depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. The program voltage can temporarily pause at an intermediate level such as Vpass to avoid a single large transition which can have undesired coupling effects. A pass voltage 1005 is applied to the unselected word lines from W419 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. Optionally, the pass voltage may be increased sooner relative to the program voltage so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. A single sense time may be used during each verify voltage. The waveform decreases from VvG to 0 V or other steady state level from t15-t16.

For the unselected word lines, the decrease in Vpass will cause the cells to transition from a conductive state to a non-conductive state. In particular, when the Vpass falls below the Vth of a cell, the channel of the cell will become cutoff, e.g., the cell will become non-conductive. The dotted line at t18 indicates when a cell with Vth=VvG becomes non-conductive. When a cell becomes non-conductive, it acts as a capacitor in which the control gate is one plate and the channel is another plate. As the pass voltage 1005 decreases from VvG to 0 V, the channel is capacitively coupled down by a similar amount, as represented by a dashed line 1015a in FIG. 10B.

The plot 1012 is shown increasing relatively quickly but this is not to scale. In practice, the verify operation, e.g., from t5-t19, may consume about 100 microseconds, while the coupling up of the word line may be significantly longer, in the millisecond range such as 10 milliseconds.

FIG. 10B depicts a plot of a channel voltage (Vch) corresponding to FIG. 10A. The channel is capacitively coupled down to a minimum level of Vch min from t18-t19 and then begins to return to its original, starting level of, e.g., 0 V from t19-t20. If the voltages of the word lines are allowed to float starting at t19, the voltages (plot 1012) are capacitively coupled higher by the increase in Vch (plot 1015b). The voltages of the word lines float to a peak level of Vwl_coupled_up. For example, VvG may be 5 V, so that there is a 5 V change in the word line voltage, e.g., 5-0 V, which is coupled to the channel. Vch_min may be about −5 V in this example. There is a 5 V increase in Vch which is coupled to the word line, e.g., control gate, of the cells. Vwl_coupled_up may be about 4 V.

In contrast, if the voltages of the selected and unselected word lines are driven at a steady state level for a specified time after Vpass is ramped down, the coupling up of the word lines can be prevented or reduced. The plot 1005d shows the word lines being driven at ground (0 V) or other steady state level which is relatively low, compared to Vpass, e.g., perhaps 0-10% of Vpass. In this example, the drivers of the unselected word lines are commanded to output Vpass at t0. However, due to an RC time constant, some time is required to reach Vpass. Similarly, the drivers of the unselected word lines are commanded to output 0 V at t17, but some time is required to reach 0 V, e.g., at about t19. The unselected word lines are actually driven at 0 V from t19-t20 in this example although the driver tries to drive them at 0 V from t17-t20. At t20, the drivers of the unselected word lines are disconnected from the word lines so that the word line voltages can float slightly higher, as depicted by plot 1005e. However, this coupling up is much smaller than that depicted by plot 1012. A small amount of coupling up of the word lines such as 1-2 V (compared to 5 V) will not significantly change the Vth of the associated memory cells and is therefore acceptable in this example.

By grounding the word lines for a specified amount of time after Vpass is stepped down, coupling up of the word lines can be reduced so that the Vth of the cells is not significantly shifted. The cells essentially remain in the first read condition. In this example, the read voltages of FIGS. 8A, 8C and 8E which correspond to the first read situation may be used in a subsequent read operation.

FIG. 10C depicts a plot of example waveforms in a read operation, where Vpass is applied continuously with read voltages of different pages. A read operation is similar to a verify operation as both are sensing operations and both can provide a coupling up of the word line voltages. The horizontal axis depicts time and the vertical axis depicts word line voltage, Vwl. A pass voltage 1025 is applied to the unselected word lines from t0-t9 and reaches a magnitude of Vpass. The pass voltage includes an increasing portion 1025a, a portion 1025b at Vpass and a decreasing portion 1025c. A read voltage includes a separate waveform 1120 (at levels of VrA2 and VrE1), 1121 (at levels of VrB2, VrD2 and VrF1) and 1122 (at levels of VrC2 and VrG1) for each of the lower, middle and upper pages, respectively, consistent with FIGS. 8C and 8D. The read voltages are applied to the selected word line. An eight-level memory device is used in this example.

When VrA2 is applied, one sense time at t2 or two sense times at t2a and t2b may be used. When VrE1 is applied, one sense time at t3 or two sense times at t3a and t3b may be used. When VrB2 is applied, one sense time at t4 or two sense times at t4a and t4b may be used. When VrD2 is applied, one sense time at t5 or two sense times at t5a and t5b may be used. When VrF1 is applied, one sense time at t6 or two sense times at t6a and t6b may be used. When VrC is applied, one sense time at t7 or two sense times at t7a and t7b may be used. When VrG1 is applied, one sense time at t8 or two sense times at t8a and t8b may be used.

The option for one sense time for each read voltage may be used when the word lines are grounded so that coupling up of the word line voltages is reduced and the cells remain in the first read situation. The option for two sense times for each read voltage may be used when the word lines are not grounded so that significant coupling up of the word line voltages does occur due to the read operation, and the cells can transition from the first read situation to the second read situation, or remain in the second read situation.

For the unselected word lines, the decrease in Vpass will cause the cells to transition from a conductive state to a non-conductive state, as discussed. The dotted line at t13 indicates when a cell with Vth=VvG becomes non-conductive. As the pass voltage 1025 decreases from VvG to 0 V, the channel is capacitively coupled down by a similar amount, as represented by a dashed line 1035a in FIG. 10D.

In another option, the voltages of the selected and unselected word lines are driven at a steady state level such as 0 V for a specified time after the ramp down of Vpass. The plot 1025d shows the word lines being driven at ground (0 V) or other steady state level which is relatively low. The drivers of the unselected word lines are commanded to output 0 V at t9, but some time is required to reach 0 V, e.g., at about t11. The unselected word lines are actually driven at 0 V from t11-t12. The driver tries to drive the unselected word lines at 0 V from t9-t12. At t12, the drivers of the unselected word lines are disconnected from the word lines so that the word line voltages can float slightly higher, as depicted by plot 1025e.

FIG. 10D depicts a plot of a channel voltage (Vch) corresponding to FIG. 10C. The channel is capacitively coupled down to a minimum level of Vch_min from t13-t14 and then begins to return to its original, starting level of, e.g., 0 V from t14-t15. If the voltages of the word lines are allowed to float starting at t14, the voltages (plot 1032) are capacitively coupled higher by the increase in Vch (plot 1035b). The voltages of the word lines float to a peak level of Vwl_coupled_up, as discussed.

FIG. 10E depicts the waveforms of FIG. 10C showing a decay of the coupled up voltage of the word line. The time scale is different than in FIGS. 10A-10D and represents a longer time period such as one hour. The plot 1123 depicts the read voltages in a time period t0-t1. A plot 1125 depicts an increase in Vwl to a coupled up level (Vwl_coupled_up) due to coupling (in a time period t1-t2) followed by a decay of Vwl in a time period t2-t3. Generally, the increase in Vwl occurs relatively quickly compared to the time period of the decay. In case the word lines are grounded as discussed, they will not be coupled up as depicted by plot 1125.

FIG. 10F depicts a plot of a channel voltage consistent with FIG. 10E. A decrease to Vch_min followed by an increase (plot 1126) occurs in the time period t1-t2. Vch is about 0 V from t2-t3 (plot 1127).

FIG. 10G depicts a plot of a Vth of a memory cell connected to the coupled up word line, consistent with FIGS. 10E and 10F. For a cell in an example data state, such as the A state, the Vth is at an initial level, Vth initial, from t0-t1. Vth increases from t1-t2 (plot 1128) due to coupling at the same time as the increase in Vch, to a peak level of Vth_coupled_up. The Vth then gradually decreases back to Vth initial from t1-t3. This example applies when the word line voltage is allowed to be coupled up rather than being grounded, as discussed.

FIG. 10H1 depicts a plot of example waveforms in a read operation, where Vpass is applied separately during read voltages of different pages, and two sense times are used during a read voltage of a data state. The figure is consistent with the process of FIG. 13A1. Vpass is ramped up and then back down separately during the read voltages of each of the lower, middle and upper pages as depicted by plots 1140, 1141 and 1142, respectively. This example is for an eight-state memory device. The example can be modified for fewer states (e.g., four states and two pages) or additional states (e.g., sixteen states and four pages). In one approach, the grounding of the word line voltages occurs after each ramp down of Vpass and one sense time per read voltage is used. For example, the plots 1140*b*, 1141*b* and 1142*b* may represent a grounding voltage being applied.

In another approach, the word line voltages are floated after each ramp down of Vpass and two sense times per read voltage are used. For example, the plots 1140*c*, 1141*c* and 1142*c* may represent the word line voltages being floated and coupled up. The amount of the coupling may be limited by the time between the ramp up of Vpass for each page.

In a first portion of the read operation, the A and E states are read using a read voltage waveform 1140*a*. When VrA2 is applied, one sense time at t2 or two sense times at t2*a* and t2*b* may be used. When VrE1 is applied, one sense time at t3 or two sense times at t3*a* and t3*b* may be used. In a second portion of the read operation, the B, D and F states are read using a read voltage waveform 1141*a*. When VrB2 is applied, one sense time at t7 or two sense times at t7*a* and t7*b* may be used. When VrD2 is applied, one sense time at t8 or two sense times at t8*a* and t8*b* may be used. When VrF1 is applied, one sense time at t9 or two sense times at t9*a* and t9*b* may be used. In a third portion of the read operation, the C and G states are read using a read voltage waveform 1142*a*. When VrC2 is applied, one sense time at t12 or two sense times at t12*a* and t12*b* may be used. When VrG1 is applied, one sense time at t13 or two sense times at t13*a* and t13*b* may be used.

FIG. 10H2 depicts a plot of example waveforms in a read operation, where Vpass is applied separately during read voltages of different pages, and two read voltages are used for a data state. One sense time is used per read voltage. The figure is consistent with the process of FIG. 13A2. Vpass is ramped up and then back down separately during the read voltages of each of the lower, middle and upper pages as depicted by plots 1140, 1141 and 1142, respectively. This example is for an eight-state memory device.

In a first portion of the read operation, the A and E states are read using a read voltage waveform 1140*d*. When VrA1 and VrA2 are applied, sense times at t2*c* and t2*d*, respectively, may be used. When VrE2 and VrE1 are applied, sense times at t3*c* and t3*d*, respectively, may be used. In a second portion of the read operation, the B, D and F states are read using a read voltage waveform 1141*d*. When VrB1 and VrB2 are applied, sense times at t7*c* and t7*d*, respectively, may be used. When VrD1 and VrD2 are applied, sense times at t8*c* and t8*d*, respectively, may be used. When VrF2 and VrF1 are applied, sense times at t9*c* and t9*d*, respectively, may be used. In a third portion of the read operation, the C and G states are read using a read voltage waveform 1142*d*. When VrC1 and VrC2 are applied, sense times at t12*c* and t12*d*, respectively, may be used. When VrG2 and VrG1 are applied, sense times at t13*c* and t13*d*, respectively, may be used.

This approach applies the lower read voltage before the higher read voltage for each state as an example. The read voltages are consistent with FIG. 8C.

An apparatus consistent with FIG. 10H2 includes: a set of memory cells, the memory cells are arranged in strings and connected to a set of word lines; a sense circuit connected to each string, each sense circuit comprising a sense node, a first latch and a second latch; and a control circuit. The control circuit is configured to, in response to a read command: apply one read voltage to a selected word line of the set of word lines; during application of the one read voltage, for each sense circuit, charge the sense node, connect the sense node to one end of the string, determine voltages of the sense node at first and second times relative to a trip voltage, and store data in the first and second latches based on the determined voltages; evaluate the data in the first latches and second latches to determine which of the first latches and second latches includes data with fewest errors and select the data in one of the first latches and the second latches including data with fewest errors as read data. The selection can be of the data in the first latches or the data in the second latches, but not both the data in the first latches and the data in the second latches, as read data.

Figure 11C:
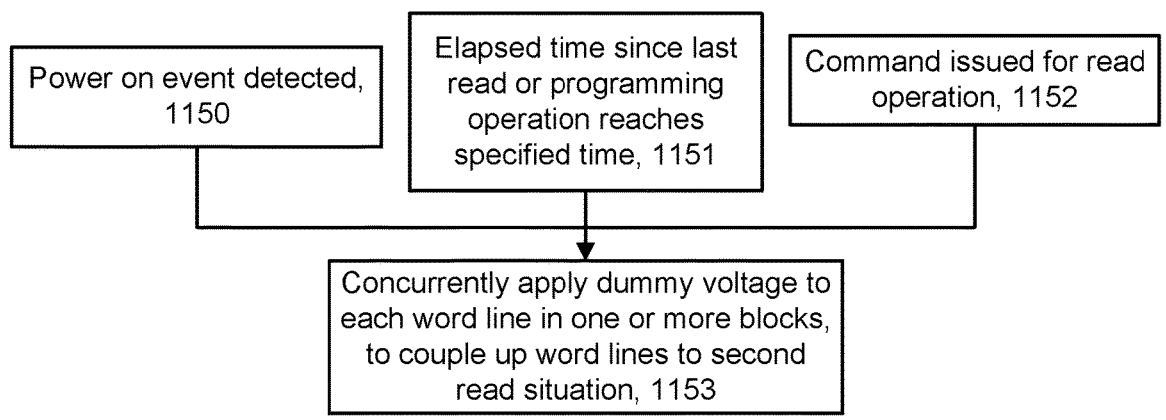
FIG. 11C depicts a process for applying a dummy voltage to word lines in one or more blocks to couple up the word lines to the second read situation.

FIG. 11A depicts a plot of an example dummy voltage of a word line and a subsequent coupled up voltage of the word line. The fourth feature involves using a dummy voltage to avoid the first read situation. Instead, the dummy voltage triggers the coupling up of the word line voltage so that the second read situation is present when a read command is issued. One option is to apply the dummy read voltage in response to the issuance of a read command from the controller. To avoid a read time penalty, another option is to apply the dummy read voltage in response to a specified trigger such as the passage of a specified amount of time, e.g., 1-2 hours, since a last sensing operation. See FIG. 11C. This approach provides a periodic coupling up of Vwl so that a read operation can occur without delay in the normal read situation. Another specified trigger is the detection of a power on event. Other triggers are possible as well. For example, the dummy voltage can be applied when the memory device is in an idle state or when no other tasks with a higher priority are pending. In this case, a single sense time can be used if it is assumed that the cells are expected to be in the second read situation. Or, two sense times can be used if it is assumed that the cells are expected to transition back and forth between the first and second read situation. Recall that when two sense times are used during one read voltage, two pages of data can be obtained and evaluated so that one of the pages is selected as the read data.

The magnitude of the dummy voltage, Vdummy, should be at least as high as a highest verify voltage of the different verify voltages used to program memory cells to different data states, in one implementation. For example, for a memory device with four, eight or sixteen states, Vdummy should be at least VvC, VvG or VvS15, respectively. This ensures that the maximum coupling down of Vch and the maximum coupling up of Vwl will occur.

One approach to applying a dummy voltage is to apply the voltage to all data word lines in a block concurrently. Another approach is to apply the voltage to fewer than all data word lines in a block concurrently. When the dummy voltage is applied, in one approach, the bit line voltage Vbl=0 V, and the voltages of the select gate control lines and the dummy word lines is sufficiently high to provide the select gate transistors and the dummy memory cells, respectively, in a conductive state, e.g., so the channel is not cutoff. By applying the dummy voltage at a sufficiently high level and then decreasing it back to 0 V, for instance, the normal read situation is provided before initiating a read operation.

The horizontal axis depicts time and the vertical axis depicts word line voltage, Vwl. A dummy voltage 1100 (e.g., a voltage pulse or waveform) is applied to the word lines in a block from t0-t5 and reaches a magnitude of Vdummy. The voltage includes an increasing portion 1100a, a portion 1100b at Vdummy and a decreasing portion 1100c. Vdummy may be requested at t1 and 0 V may be requested at t3. The voltage drivers may be commanded to no longer provide a voltage at t5 (e.g., to disconnect the voltage drivers from the word lines) to allow the voltages to float.

A control circuit may be configured to command a voltage driver to increase voltages of the word lines from an initial level (e.g., 0 V) to an elevated level (e.g., Vdummy), and then to decrease the voltages of the word lines from the elevated level to a final level (e.g., 0 V). The control circuit, to float the voltages of the word lines, is configured to disconnect the voltage driver from the word lines a specified time (e.g., after a time duration of t5-t3) after requesting that the voltage driver decrease the voltages of the word lines from the elevated level to the final level.

At t4, the voltage falls below VvG so that the memory cells in the G state are made non-conductive state. The remaining transition of the voltage provides capacitive coupling, as discussed. Memory cells in lower states are made non-conductive when the voltage falls lower. Different contributions to the coupling up of a word line can therefore be made by the different cells connected to the word line according to their respective data states. An overall coupled up voltage on the word line will be provided.

As the dummy voltage 1100 decreases from VvG to 0 V, the channel is capacitively coupled down by a similar amount, as represented by a dashed line 1110a in FIG. 11B.

FIG. 11B depicts a plot of a channel voltage which is coupled down from a starting level, e.g., 0 V, and subsequently returns to the starting level, consistent with FIG. 11A. The channel is capacitively coupled down to a minimum level of Vch_min and then begins to return to its starting level from t5-t6. The voltages of the word lines are allowed to float starting at t5, so that the voltages (plot 1102) are capacitively coupled higher by the increase in Vch (plot 1110b). The voltages of the word lines float to a peak level of Vwl_coupled_up.

The dummy voltage can be implemented using firmware in the external controller combined with logic in the on-chip control circuitry. A new command can be defined in the on-chip control circuitry that applies a dummy read voltage to multiple blocks, without any host read request. This process does not involve any updates to the latches because no sensing occurs. The purpose of the dummy voltage is to place the memory array into the second read situation. With the new command, after each power up, (or periodically using a timer), we read all blocks using the multi block read command.

FIG. 11C depicts a process for applying a dummy voltage to word lines in one or more blocks to couple up the word lines to the second read situation. Various conditions can trigger the coupling up of the word lines. For example, step 1150 indicates that a power on event is detected. For instance, an event handler in a controller can determine whether a power on event has been detected. Step 1151 indicates that an elapsed time since a last read or programming operation, e.g., a last sensing operation, reaches a specified time. For example, this step can be responsive to a timer implemented by a controller. Step 1152 determines that a command has been issued for a read operation. If any of these steps occur, step 1153 is performed. This step involves concurrently applying a dummy voltage to each word line in one or more blocks to couple up the word lines to the second read situation. By concurrently applying the dummy voltage, the time allocated to the dummy voltage is minimized.

One approach is to apply a dummy voltage concurrently to all data word lines in each of one or more blocks. This can include data word lines but not dummy word lines, or both data word line and dummy word lines. Another approach is to apply the dummy voltage concurrently to fewer than all data word lines in a block in each of one or more blocks. Another approach is to apply dummy voltages one after another to different sets of word lines in a block. Another approach is to apply dummy voltages to one or more blocks at a time.

Figure 12A:
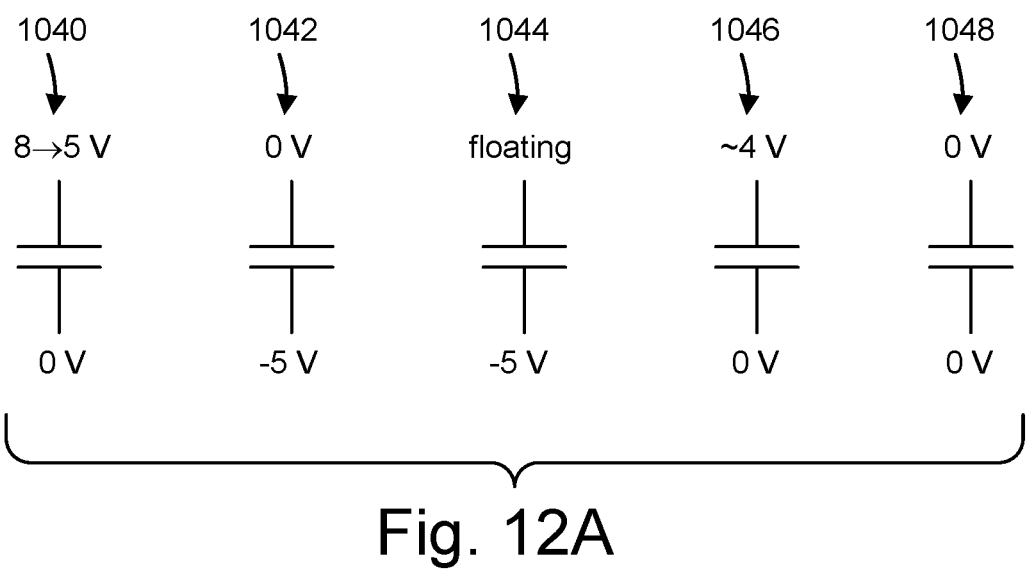
FIG. 12A depicts control gate and channel voltages on a memory cell which acts as a capacitor when the control gate voltage is decreased in a sensing operation.

FIG. 12A depicts control gate and channel voltages on a memory cell which acts as a capacitor when the control gate voltage is decreased in a sensing operation. The first read issue is caused by the stacking of word line planes or layers in 3D, where the channels of the memory cells are floating and not coupled to the substrate as in 2D Flash NAND architectures. Word line coupling and electron trapping in oxide-nitride-oxide (ONO) layers are the sources of the first read issue.

As discussed, after a read/verify operation, when the read pass voltage (Vread) applied on a word line ramps down, the G-state cells, for example, with Vth-5 V, cut off the channel when Vread reduces to 5V. The floating channel potential then is pushed down to a negative value when Vread is further reduced to Vss. Next, the negative voltage in the channel shown above (about −5 V) increases after the read operation finishes by attracting positive charges. Since the data word lines are floating, the amount of holes needed to charge up the channel is relatively small, so the selected word line can be quickly coupled up to around 4 V.

The unselected word lines can similarly be coupled up. The potential on the selected word line remains at ~4 V for a while. This attracts and traps electron in the tunnel ONO layers and causes a Vth upshift, for instance, at least for the lower data states. The word line voltage thus rises to about 4 V after the read operation due to the coupling of the word line to the floating channel potential.

The top plate represents the control gate or word line and the bottom plate represents the channel. The capacitor 1040 represents a memory cell in the time period of t17-t18 in FIG. 10A or t9-t10 in FIG. 10C, where Vpass=8 V and VvG=5 V. The word line voltage transitions from 8 to 5 V and Vch=0 V. The capacitor 1042 represents a memory cell at t19 in FIG. 10B or t11 in FIG. 10C. Vwl=0 V and Vch=−5 V. The capacitor 1044 represents a memory cell just after t19 in FIG. 10A or just after t11 in FIG. 10C. Vwl floats and Vch=−5 V. The capacitor 1046 represents a memory cell after t20 in FIG. 10A or after t13 in FIG. 10C. Vwl=4 V and Vch=0 V. Here, the word line is in a maximum coupled up state. If the Vth of the memory cell is less than 4 V, the memory cell will be weakly programmed so that its Vth increases. If the Vth of the memory cell is more than 4 V, the memory cell will be weakly erased so that its Vth decreases. The capacitor 1048 represents a memory cell after a significant amount of time has passed, e.g., an hour or more. Vwl=0 V and Vch=0 V. See t3 in FIG. 10E.

When a data word line voltage floats, the amount of holes needed to charge up the channel is relatively small. As a result, the selected word line can be relatively quickly coupled up to about 4 V, for example. The potential on the selected word line remains at ~4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read situation will occur again, resulting in an elevated number of read errors if a corrective action is not taken, such as periodically applying a dummy voltage which simulates the word line coupling up effects of a sensing operation, and/or adjusting the read voltages.

Figure 12B:
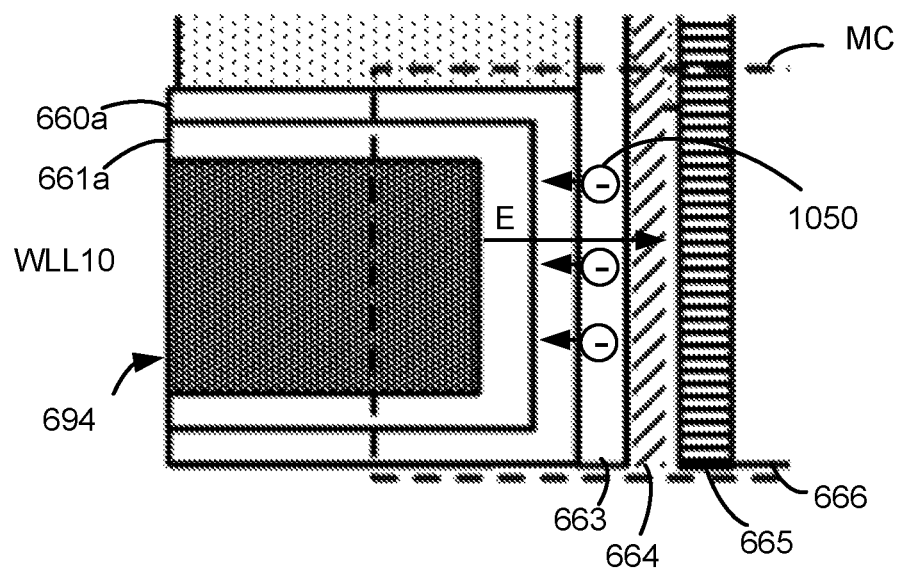
FIG. 12B depicts a portion of the memory cell MC of FIG. 6 showing electron injection into a charge trapping region during weak programming.

FIG. 12B depicts a portion of the memory cell MC of FIG. 6 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps. A weak erasing similarly involves an electric field which repels electrons from the charge trapping layer, decreasing the Vth.

FIG. 13A1 depicts an example read process for memory cells using first and second sense times in a sense circuit. This approach provides a system solution in which two read strobes are applied to the sense circuits per read voltage (Vcgr level) with a time delay between them, to provide two sense times. We increase the read integration time and latch the two results.

At step 1300, a read command is issued for a page of data stored in memory cells connected to a selected word line. Step 1301 applies a read voltage (Vcgr) to the selected word line and read pass voltages to unselected word lines. Step 1302 includes charging the sense nodes in the sense circuits. Step 1303 includes allowing the sense nodes to discharge into the bit lines, e.g., by connecting the sense node to one end of the string such as the drain end via the bit line. Transistors in a sense circuit can be controlled to connect the sense node to the bit line at a specified time.

Step 1304 includes determining whether the sense node has discharged below a trip voltage at a first sense time, and, in response to this determining, setting a first latch in each sense circuit when the Vcgr is for lower data states or a second latch when Vcgr is for higher data states. In one approach, there are eight data states, including the erased state and seven programmed states, and among the programmed states, the lower data states are A, B, C and D and the higher data states are E, F and G. The lower data states can include states below a specified state and the higher data states can include states at and above the specified state. In this example, the E state is the specified state. A state may be below a specified state when the Vth level (or verify level) of the state is below the Vth level (or verify level) of the specified state. A state may be above a specified state when the Vth level (or verify level) of the state is above the Vth level (or verify level) of the specified state. In one approach, Vcgr is for lower data states when Vcgr is VrA2, VrB2, VrC2 or VrD2 and Vcgr is for higher data states when Vcgr is VrE1, VrF1 and VrG1. See FIGS. 14B to 14D and 20-22.

A first set of latches comprises the first latch in each sense circuit and a second set of latches comprises the second latch in each sense circuit.

The setting of a bit in a latch can follow the bit assignments of FIGS. 8B, 8D and 8F, for instance. The data in a latch may be based on voltages of the sense node at different times when each of multiple read voltages is applied to the selected word line, such as in connection with reading a page of data.

Step 1305 includes determining whether the sense node has discharged below the trip voltage at a second sense time, and, in response to this determining, setting a second latch in each sense circuit when the Vcgr is for lower data states or a first latch when Vcgr is for lower data states. In this example, the same trip voltage is used at the first and second sense times. This allows for a less complex circuit. In another option, different trip voltages are used at the first and second sense times.

A decision step 1306 determines whether there is a next read voltage to apply for the page. If the decision step is true, step 1301 is repeated using a next read voltage. If decision step 1306 is false, step 1307 includes evaluating data in the first and second latches to determine which of the first latches and second latches includes data with fewest errors. In one approach, this includes separately, for each page of data, determining a number of parity check equations which are satisfied by the pages of data in the first and second sets of latches. See FIG. 16A to 17. A higher number of parity check equations which are not satisfied correlates to a higher bit error rate. Based on this evaluation, step 1308 includes selecting the data in the first or second latches as read data. That is, either the first or second page of data (not both) is selected as being the most accurate read result. The method selects the data in one of the first latches and the second latches including data with fewest errors as read data. This evaluation and selection can be performed by the on-chip control circuitry 110, for instance, and the selected page of data can be output from the on-chip control circuitry to the external controller 122, in one approach. This step involves making a selection of the data in the first latches or the data in the second latches, but not both the data in the first latches and the data in the second latches, as read data.

At decision step 1309, if there is a next page to read, the process continues at step 1301 with the next read voltage. If decision step 1309 is false, the read process is done at step 1310. Generally, the reading of a page of data can involve one or more read voltages, such as discussed in connection with FIG. 8A to 8F.

FIG. 13A2 depicts another example read process for memory cells using one sense time in a sense circuit. This approach involve using two Vcgr levels such as depicted in FIG. 10H2 for each data state. One sense time is used per Vcgr level.

At step 1330, a read command is issued for a page of data stored in memory cells connected to a selected word line. Step 1331 begins a read for a data state. Step 1332 applies one read voltage for the data state to the selected word line and read pass voltages to unselected word lines. Step 1333 includes charging the sense nodes in the sense circuits. Step 1334 includes allowing the sense nodes to discharge into the bit lines. Step 1335 includes determining whether the sense node has discharged below a trip voltage at a sense time, and, in response to this determining, setting first latches.

Step 1336 applies another read voltage for the data state to the selected word line and read pass voltages to unselected word lines. Step 1337 includes charging the sense nodes in the sense circuits. Step 1338 includes allowing the sense nodes to discharge into the bit lines. Step 1339 includes determining whether the sense node has discharged below a trip voltage at the sense time, and, in response to this determining, setting second latches. The same sense time (discharge time) can be used in steps 1335 and 1339, in one approach.

A decision step 1340 determines whether there is a next data state to read for the page. If the decision step is true, step 1331 is repeated to begin a read for the next data state. If decision step 1340 is false, step 1341 includes evaluating data in the first and second sets of latches. In one approach, this includes determining a number of parity check equations which are satisfied by the pages of data in the first and second sets of latches. Based on this evaluation, step 1342 includes selecting the data in the first or second sets of latches as read data. At decision step 1343, if there is a next page to read, the process continues at step 1332 with the next data state. If decision step 1343 is false, the read process is done at step 1344.

For example, referring to FIG. 10H2, for a read of the A state, the one read voltage at step 1332 may be VrA1 and the another read voltage at step 1336 may be VrA. For a read of the E state, the one read voltage at step 1332 may be VrE1 and the another read voltage at step 1336 may be VrE1. The lower page data is determined using these reads.

The process may be used in various situations where the Vth distributions of the data states have shifted. By reading the cells at two Vcgr levels for one data state, two sets of latch data can be provided. The sets of latch data can be evaluated to determine which is most accurate (has the fewest errors) and this data can be used as the read data. This concept can be extended to using more than two Vcgr levels for one data state. FIG. 13B depicts an example read process in which word line voltages are grounded for a specified time period to reduce coupling up of the word lines, consistent with the second feature. This is a circuit solution in which we ground the accessed word line plane after a read or verify operation in order to prevent coupling up of the word line voltages. The grounding is generally for a longer period of time than would otherwise be used.

At step 1360, at a first time (e.g., t0 in FIG. 10C, and t0, t6 and t12 in FIG. 10H1), a WLunsel voltage driver (e.g., 2304 in FIG. 24) is commanded to increase voltages of the unselected word lines from an initial level (e.g., 0 V) to Vpass, a read pass voltage. Vpass is high enough to place the associated unselected cells in a conductive state. Vpass is then maintained at the elevated level for a specified time.

At step 1361, at the same time or after the first time (e.g., just before t2, t4 and t7 in FIG. 10C, and just before t2, t7 and t12 in FIG. 10H1), a WLsel voltage driver (e.g., 2305 in FIG. 24) is commanded to increase voltages of the selected word lines from an initial level (e.g., 0 V) to one or more read voltages.

Step 1362 includes performing sensing during each read voltage, e.g., using one or two sense times.

At step 1363, at a subsequent time (e.g., t9 in FIG. 10C, and t4, t10 and t14 in FIG. 10H1), the WLsel voltage driver is commanded to decrease the voltage from the read pass voltage to ground. This request can be for a step change or a gradual ramp decrease, for instance.

At step 1364, at a subsequent time (e.g., just after t3, t6 and t8 in FIG. 10C, and just after t3, t9 and t13 in FIG. 10H1), the WLunsel voltage driver is commanded to decrease the voltage from the read pass voltage to ground. This request can be for a step change or a gradual ramp decrease, for instance. The grounding can be for a period of time which is sufficient to limit the coupling up of the unselected word lines to, e.g., less than 25% of the pass voltage. For example, with Vpass=8 V, grounding can be for a period of time which is sufficient to limit the coupling up of the unselected word lines to less than 2 V. The period of time can be determined from testing or simulation. In some implementations, the period of time is 100 to 200 microseconds.

Subsequently, step 1365 includes causing the voltage of the selected word lines to float by disconnecting the WLsel driver from the selected word line and, concurrently, step 1366 includes causing the voltages of the unselected word lines to float by disconnecting the WLunsel driver from the unselected word lines. Recall that this floating may result in only a small coupling up of the word line voltages since the time period of the grounding prevents a more significant coupling up. For example, the floating can begin at t12 in FIG. 10C and at t15 in FIG. 10H1.

A related method comprises: applying a read voltage to a selected word line among a plurality of word lines, wherein the plurality of word lines are connected to a set of memory cells and the memory cells are arranged in strings; applying a pass voltage to unselected word lines of the plurality of word lines; sensing a conductive state of selected memory cells in the set of memory cells during the applying of the read voltage and the applying of the pass voltage; driving down a voltage of the selected word line from the read voltage to a respective steady state voltage; driving down voltages of the unselected word lines from the pass voltage to a respective steady state voltage; and enforcing a period of time in which driving of the respective steady state voltage of the unselected word lines is maintained. The method further includes upon expiration of the period of time, floating a voltage of the unselected word lines.

A related apparatus includes means for performing each of the above steps.

Figure 21:
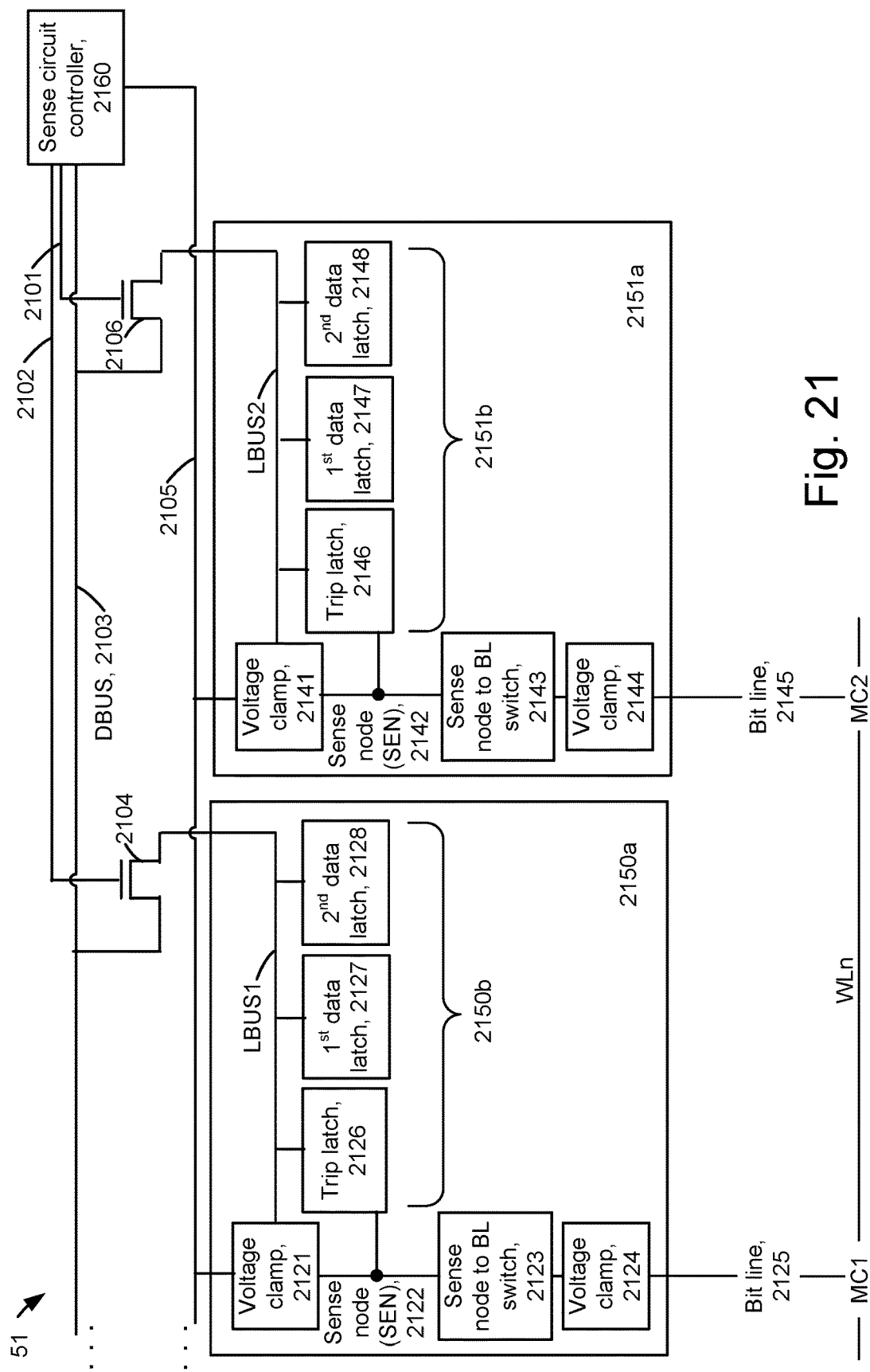
FIG. 21 depicts another example block diagram of a sense block 51 in the column control circuitry of FIG. 1B.

FIG. 14A depicts a plot of the discharging of a sense node voltage in a sense circuit at a time td and sensing at times ts1 and ts2, for cells in lower and higher data states. Example sense nodes 2122 and 2142 are depicted in FIG. 21. As mentioned, in the sense circuits, a sense node is charged and allowed to communicate with a bit line. The amount of discharge of the sense node is sensed relative to a trip voltage at first and second sense times, and corresponding data is stored in first and second latches of the sense circuits. Data from the first and second sense times is stored in the first and second latches, respectively, or in the second and first latches, respectively. First and second pages of data are stored in the first and second latches, respectively, across the sense circuits. The vertical axis depicts Vsen, a sense node voltage and the horizontal axis depicts time.

A plot 1400 depicts the increase of the sense node voltage to Vpre-charge due to the pre-charging process which begins at t0. See also FIG. 21. At a discharge time, td, the sense node is allowed to discharge through the bit line and the string of cells. The time periods of ts1-$td$ or ts2-$td$ are sense periods or integration times. The amount of discharge is limited by the conductivity of the cell being read (the selected cell). If the cell is in a non-conductive state (plot 1401), Vsen does not fall below the trip voltage, Vtrip, at the first and second sense times is 1 and ts2, respectively. Plots 1402 and 1403 depicts the case of the cell being in a conductive state. Recall that for a cell in a lower data state, the Vth is lower when the cell is in the first read situation than in the second read situation. Vsen will therefore discharge to a relatively low voltage (there will be a relatively large amount of discharge) as depicted by plot 1403 if VrA2 is applied to the word line. The Vth is slightly higher when the lower state cell is in the second read situation than in the first read situation. Vsen will therefore discharge to a slightly higher voltage (there will be a relatively small amount of discharge) as depicted by plot 1402 if VrA2 is applied to the word line. Thus, plot 1403 represents a lower state cell in a conductive state in the first read situation, and plot 1402 represents a lower state cell in a conductive state in the second read situation.

For a cell in a higher data state, the Vth may be higher when the cell is in the first read situation than in the second read situation. Plot 1402 would represent a higher state cell in a conductive state in the first read situation. Plot 1403 would represent a higher state cell in a conductive state in the second read situation.

The point 1404 of plot 1402 shows that Vsen>Vtrip at ts1. The point 1405 of plot 1402 shows that Vsen<Vtrip at ts2. The point 1406 of plot 1403 shows that Vsen<Vtrip at ts1. The point 1407 of plot 1403 shows that Vsen<Vtrip at ts2. If we assume bit=1 denotes the conductive state and bit=0 denotes the non-conductive state, a cell which followed plot 1402 would have a 0 assigned at ts1 and a 1 assigned at ts2. A cell which followed plot 1403 would have a 1 assigned at both ts1 and ts2. For a page of data, the bit value in the latch can be set based on the bits assigned during each of one or more read voltages used to read the page, consistent, e.g., with the bit assignments of FIGS. 8B, 8D and 8F.

The sense times, and the difference between the first and second sense times, can be adjusted based on the read voltage, e.g., based on the data state. Moving the sense time lower is analogous to moving the read voltage lower, because it makes it harder for the cell to be in a conductive state. See FIG. 15A to 15F.

Accordingly, for a lower data state cell such as an A state cell in the first read condition, sensing at ts1 is optimal if VrA2 (the optimal read voltage for the second read situation) is applied to the word line. For such a cell in the second read condition, sensing at ts2 is optimal. If ts1-$td$ is too small, some cells in the Er state may incorrectly be sensed as being in a non-conductive state and therefore classified into the A state. If ts1-$td$ is too large, some cells in the A state may incorrectly be sensed as being in a conductive state and therefore classified into the Er state. For a higher data state cell such as a G state cell in the first read condition, sensing at ts2 is optimal. if VrG1 (the optimal read voltage for the first read situation) is applied to the word line If ts2-$td$ is too small, some cells in the F state may incorrectly be sensed as being in a non-conductive state and therefore classified into the G state. If ts1-$td$ is too large, some cells in the G state may incorrectly be sensed as being in a conductive state and therefore classified into the F state.

Essentially, assuming the read voltage is set for each data state as the higher of: (a) the read voltage which is optimal for the first read situation and (b) the read voltage which is optimal for the second read situation, the read data from the first sensing time will be optimal for lower data states when the block is in the first read condition or for higher data states when the block is in the second read condition. Similarly, the read data from the second sensing time will be optimal for lower data states when the block is in the second read condition or for higher data states when the block is in the first read condition. This is consistent with the read voltage notation in FIGS. 8A, 8C and 8E.

For a cell in a mid-range state, there may not be a significant difference in the Vth in the first read situation compared to the second read situation, as discussed in connection with FIGS. 8B, 8D and 8F. Accordingly, one option is to use a single sense time, e.g., ts2, and provide data in both latches based on this sensing.

Figure 14B:
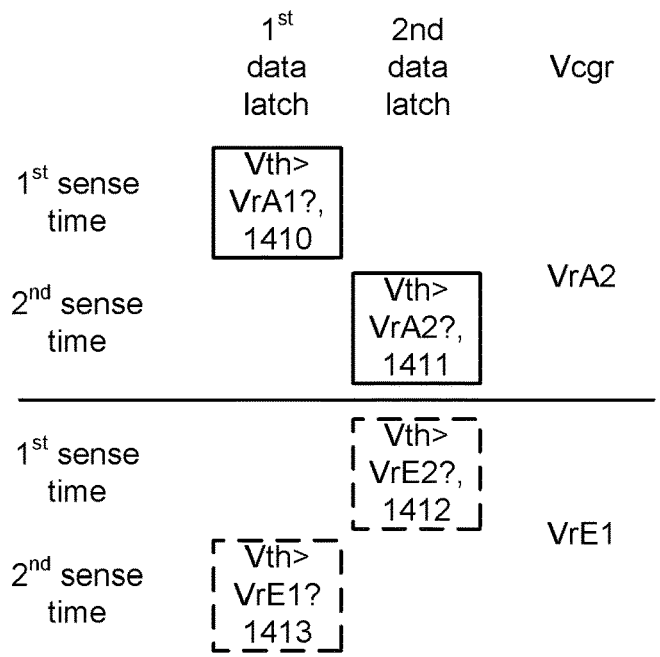
FIG. 14B depicts setting of data in first and second data latches when reading a lower page of data, consistent with the process of FIG. 13A1.
Figure 14C:
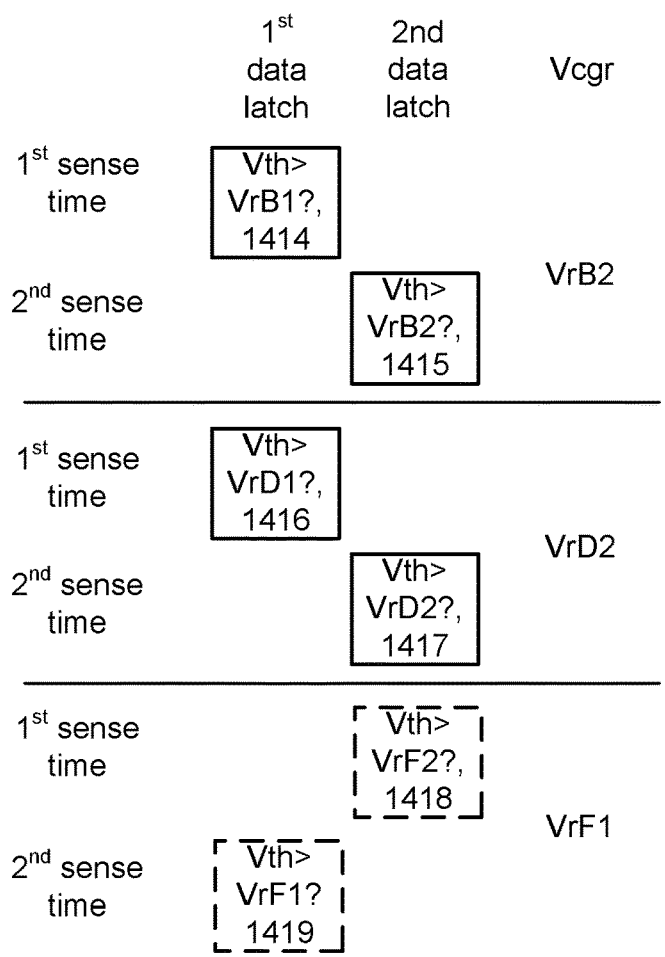
FIG. 14C depicts setting of data in first and second data latches when reading a middle page of data, consistent with the process of FIG. 13A1.
Figure 14D:
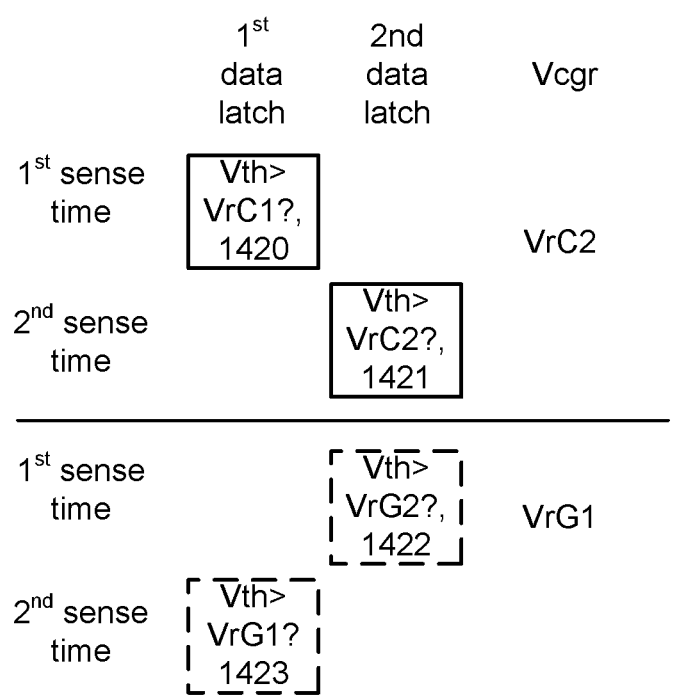
FIG. 14D depicts setting of data in first and second data latches when reading an upper page of data, consistent with the process of FIG. 13A1.

FIG. 14B depicts setting of data in first and second data latches when reading a lower page of data, consistent with the process of FIG. 13A1. In FIG. 14B to 14D, the first and second data latches may correspond to the latches 2127 and 2128, respectively, in the sense circuit 2150$a$, or to the latches 2147 and 2148, respectively, in the sense circuit 2151$a$ in FIG. 21. Further, a solid line box denotes data which is stored for a lower data state (e.g., for a data state which has a lower Vth in the first read situation compared to the second read situation), and a dashed line box denotes data which is stored for a higher data state (e.g., for a data state which has a higher Vth in the first read situation compared to the second read situation). Time progresses moving downward in each of FIG. 14B to 14D. A first column denotes the first or second sense time during a given Vcgr, which is depicted in the fourth column. The second column depicts data stored in the first data latch (a latch in a first set of latches). The third column depicts data stored in the second data latch (a latch in a second set of latches).

For example, consistent with FIG. 10H1, when Vcgr=VrA2, at the first sense time t2$a$, the first latch 1410 is updated (e.g., a bit in the latch is set to 0 or 1) based on the conductive or non-conductive state of a cell (the cell is non-conductive if Vth>VrA1) and at the second sense time t2$b$, the second latch 1411 is updated based on the conductive or non-conductive state of the cell (the cell is non-conductive if Vth>VrA2). Recall that even though Vcgr=VrA2, the Vth of the cell would have to be less than VrA1 at the shorter first sense time to be in a conductive state according to the techniques provided herein. The Vth of the cell would have to be more than VrA1 at the shorter first sense time to be in a non-conductive state. The Vth of the cell would have to be less than VrA2 at the longer second sense time to be in a conductive state. The Vth of the cell would have to be more than VrA2 at the longer second sense time to be in a nonconductive state.

Similarly, when Vcgr=VrE1, at the first sense time t3$a$, the second latch 1412 is updated based on whether Vth>VrE2 and at the second sense time t3$b$, the first latch 1413 is updated based on whether Vth>VrE1 (since E1>E2).

FIG. 14C depicts setting of data in first and second data latches when reading a middle page of data, consistent with the process of FIG. 13A1. For example, consistent with FIG. 10H1, when Vcgr=VrB2, at the first sense time t7$a$, the first latch 1414 is updated based on whether Vth>VrB1 and at the second sense time t7$b$, the second latch 1415 is updated based on whether Vth>VrB2 (since B2>B1). When Vcgr=VrD2, at the first sense time t8$a$, the first latch 1416 is updated based on whether Vth>VrD1 and at the second sense time t8$b$, the second latch 1417 is updated based on whether Vth>VrD2 (since D2>D1). When Vcgr=VrF1, at the first sense time t9$a$, the second latch 1418 is updated based on whether Vth>VrF2 and at the second sense time t9b, the first latch 1419 is updated based on whether Vth>VrF1 (since F1>F2).

FIG. 14D depicts setting of data in first and second data latches when reading an upper page of data, consistent with the process of FIG. 13A1. For example, consistent with FIG. 10H1, when Vcgr=VrC2, at the first sense time t12a, the first latch 1420 is updated based on whether Vth>VrC1 and at the second sense time t12b, the second latch 1421 is updated based on whether Vth>VrC2 (since C2>C1). When Vcgr=VrG1, at the first sense time t13a, the second latch 1422 is updated based on whether Vth>VrG2 and at the second sense time t13b, the first latch 1423 is updated based on whether Vth>VrG1 (since G1>G2).

FIG. 15A depicts a plot of a shift in Vth voltage versus data state or Vth (plot 1553), for lower, mid-range and higher data state, consistent with FIGS. 8A, 8C and 8E. As mentioned, in a first read situation, a Vth downshift may be seen for one or more lower states represented by a Vth range 1550, essentially no change in Vth may be seen in one or more midrange states represented by a Vth range 1551, and a Vth upshift may be seen for one or more upper states represented by a Vth range 1552. These shifts are relative to Vth levels in the second read situation, where dVth=0 V (plot 1554).

FIG. 15B depicts a plot of shift in Vth for different data states versus time. The time t=0 represents the time of a sensing operation while the cells are in the first read situation. The shift in read voltage is largest in magnitude at this time since the word lines are discharged and the Vth of the cells is relatively far from the Vth of the second situation for each programmed data state. The shift decreases gradually in magnitude as time progresses from 0 to tf. At tf, a shift of 0 V may be realized, in one approach. Separate plots are provided for the programmed states labelled as A, B, C, D, E, F and G, where the plots for A, B, C, D show a downshift and the plots for E, F and G show an upshift.

The horizontal axes of FIG. 15C to 15F are aligned with the axis in FIG. 15A.

FIG. 15C depicts a plot of sense time versus data state, where for lower and higher data states, ts1 varies according to a ramp function, and for mid-range data state, a single sense time is used. ts2 is fixed in this example. As discussed, ts2-ts1 can vary with data state. This difference can become progressively larger for progressively smaller and progressive larger data states. This difference can go to zero for mid-range data states. A ramp function allows the sense time to be closely matched to the expected Vth shift based on data state, for the first read situation compared to the second read situation.

In some cases, when lower states are read before the higher states, this can affect the higher states such that they transition to the second read situation. Thus, the first read sense time could be optimal for the lower states and the second read sense time for the higher states in some cases. Or, the sense times may be adjusted for higher states but not lower states. If higher states are read before the lower states, this can affect the lower states such that they transition to the second read condition. Thus, the second read sense time could be optimal for the lower states and the first read sense time for the higher states in some cases.

FIG. 15D depicts a plot of sense time versus data state, where for lower and higher data states, ts1 and ts2 are fixed at different levels and for mid-range data states, a single sense time is used. This approach allows the sense time to be correlated with the expected Vth shift based on data state, as discussed, while providing a simpler implementation than in FIG. 15C.

FIG. 15E depicts a plot of sense time versus data state, where for lower and higher data states, ts1 and ts2 have two levels each and for mid-range data states, a single sense time is used. The solid lines depict ts1 and the dashed line depicts ts2. This approach also provides a simpler implementation than in FIG. 15C but allows the sense time to be correlated with the expected Vth shift based on data state in a more fine grained way than in FIG. 15D.

FIG. 15F depicts a plot of sense time versus data state, where ts1 varies according to a ramp function and ts2 is fixed. The solid line depicts ts1 and the dashed line depicts ts2. This approach can be used as an option to continuously adjust ts2-ts1 based on the data state.

Figure 16A:
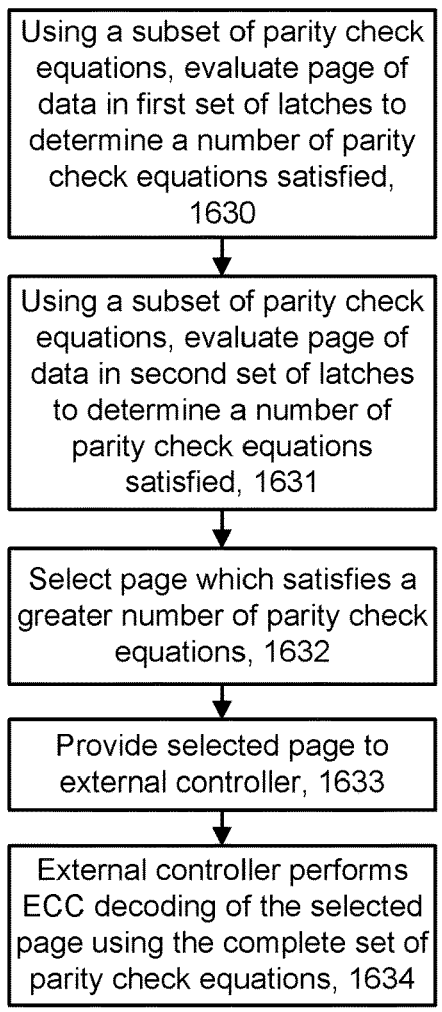
FIG. 16A depicts an example process for evaluating data in first and second sets of latches, consistent with steps 1307 and 1308 of FIG. 13A1.

FIG. 16A depicts an example process for evaluating data in first and second sets of latches, consistent with steps 1307 and 1308 of FIG. 13A1. The fand second sets of latches refers to a collection of first and second latches, respectively, in the different sense circuits. The evaluation may use parity check equations, in one approach. These are equations used in an error correction code (ECC) to determine if an error is present in data. The data which is programmed into the cells includes user data and ECC data, which is obtained by processing the user data according to an ECC. The ECC can be described in terms of a set of parity check equations, such as in FIGS. 18, 19A and 19B. Typically, the external controller 122 receives the read data and evaluates it using a complete set of parity check equations 115a (FIG. 1A). If some of the equations are not satisfied, the ECC may be able to correct the data so that it is error-free. However, if an excessive number of equations are not satisfied, the data may include uncorrectable errors and be unusable. The number of equations which are not satisfied correlates with an error rate. That is, the number of equations which are not satisfied may be used as an estimate of the number of errors.

Step 1630 includes using a subset of parity check equations to evaluate a page of data in a first set of latches to determine a number of parity check equations satisfied by the data. Step 1631 includes using the subset of parity check equations to evaluate a page of data in a second set of latches to determine a number of parity check equations satisfied by the data. Step 1632 selects one of the pages which satisfies a greater number of parity check equations (or which fails to satisfy a smaller number of parity check equations).

In one approach, the on-chip control circuitry 110 may evaluate the read data in the first and second sets of latches of the sense circuits using a subset (e.g., a strict subset or fewer than all equations) of the complete set of parity check equations. For example, see the subsets in FIG. 18. This evaluation allows the on-chip circuitry to quickly determine which page of data is more likely to reflect the original write data. The on-chip circuitry then outputs the selected page of read data to the external controller for processing using the complete set of parity check equations. In particular, step 1633 includes providing the selected page to the external controller. At step 1634, the external controller performs ECC decoding of the selected page using the complete set of parity check equations.

Figure 17:
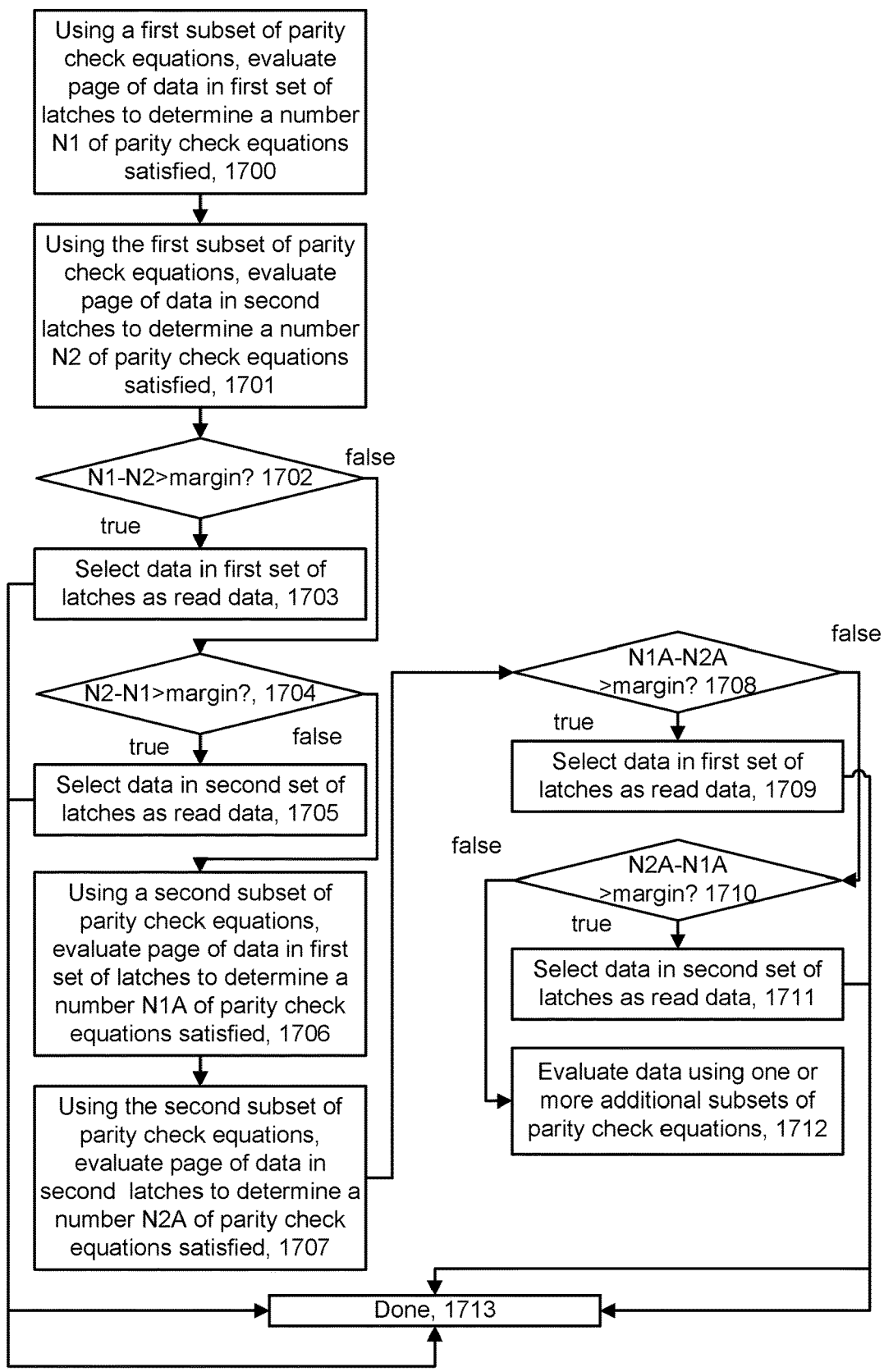
FIG. 17 depicts another example process for evaluating data in first and second latches, consistent with steps 1307 and 1308 of FIG. 13A1.

One approach, described in FIG. 17, is to count a number of parity check equations satisfied by the first and second pages of data in a first subset of equations. If there is no clear winner, the first and second pages of data may be evaluated using one or more additional subsets of equations. This approach is efficient since it can reduce the number of parity check equations which are checked.

In another option, the on-chip circuitry evaluates the pages of data using the complete set of parity check equations. In another option, the external controller evaluates the pages of data using the complete set of parity check equations or a subset of the complete set.

In another approach, when multiple pages are read in a read operation, the selection of the data from the first page can be used to guide a selection among the following pages. For example, when the selected page corresponds to the first read situation, the data from the following pages can be selected which also correspond to the first read situation. The evaluation of the following pages may be omitted to save time and power.

Figure 16B:
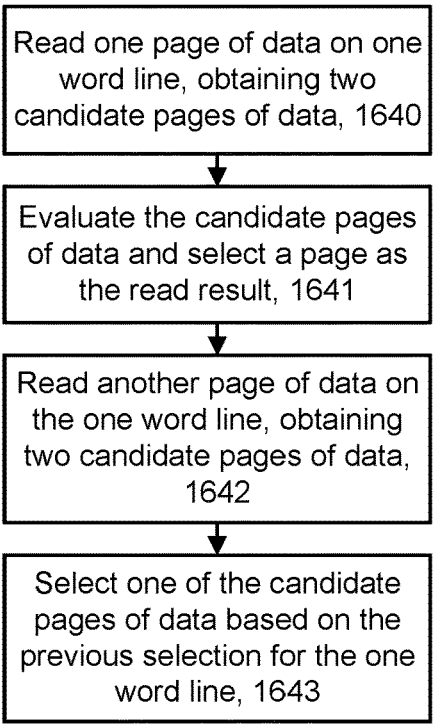
FIG. 16B depicts an example process for using the evaluation result from one page of a word line to guide the selection of another page of the word line.

For example, FIG. 16B depicts an example process for using the evaluation result from one page of a word line to guide the selection of another page of the word line. Step 1640 includes reading one page of data on one word line using two sense times per read voltage, and thereby obtaining two candidate pages of data in the first and second sets of latches of the sense circuits. Step 1641 includes evaluating the candidate pages of data and selecting a page as the read result. Step 1642 includes reading another page of data on the one word line and thereby obtaining two candidate pages of data. Step 1643 includes selecting one of the candidate pages of data of the another page of data based on the previous selection for the one age of data of the one word line, e.g., at step 1641.

In another approach, the result from evaluating the data of one word line can be used to guide a selection for another word line. For example, if the selected page of one word line indicates the one word line is in the second read situation, it can be assumed that data on another word line in the same block is also in the second read situation. The evaluation of the data on the another word line can then be omitted and a sensing result used which corresponds to the sense time of the second read situation.

However, if the selected page of one word line indicates the one word line is in the second read situation, it may not be clear whether data on another word line in the same block is also in the first read situation. This is because the reading of the one word line may cause the another word line to transition to the second read situation. In some cases, we can assume that the another word line is in the second read situation and select a page of data using a corresponding sense time. Also, if there is a delay in reading one word line after another, such as when an operation is performed in another block, it is possible that the situation of the another word line has changed. In that case, an evaluation may be performed on the data of the another word line.

Figure 16C:
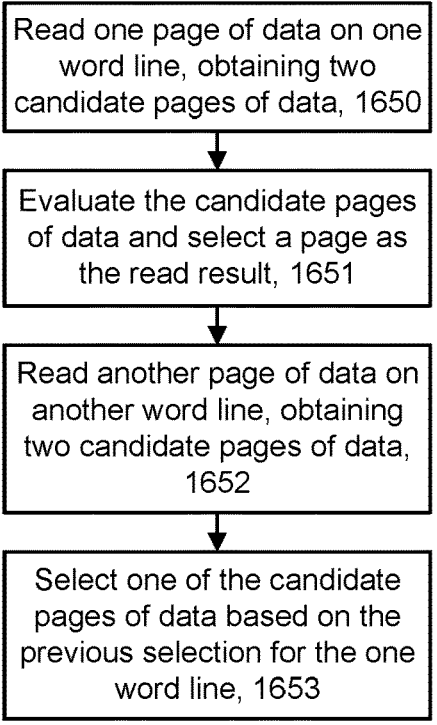
FIG. 16C depicts an example process for using the evaluation result from one page of one word line to guide the selection of another page of another word line.

For example, FIG. 16C depicts an example process for using the evaluation result from one page of one word line to guide the selection of another page of another word line. Step 1650 includes reading one page of data on one word line using two sense times per read voltage, and thereby obtaining two candidate pages of data. Step 1651 includes evaluating the candidate pages of data and selecting a page as the read result. Step 1652 includes reading another page of data on another word line and thereby obtaining two candidate pages of data. Step 1653 includes selecting one of the candidate pages of data of the another word line based on the previous selection for the one word line, e.g., at step 1651.

In another approach, one of the pages of data is provided to the external controller for evaluation using some or all of the parity check equations. If the page includes uncorrectable errors or otherwise has a high number of errors above a threshold, the external controller asks the on-chip circuitry to provide the other page of data for evaluation. If this other page of data does not contain uncorrectable errors, it is used as the read data.

For example, FIG. 16D depicts an example process in which an external controller requests another candidate page of data if a provided page is unacceptable. Step 1660 includes reading one page of data on one word line using two sense times per read voltage, and thereby obtaining two candidate pages of data. Step 1661 includes providing one of the candidate pages of data to the external controller. For example, this can be a random selection or a selection made based on a previous history. At step 1662, the external controller evaluates the candidate page of data to determine whether it is acceptable, e.g., based on a number of parity check equations which are satisfied or based on a number of errors.

In one option, at step 1663, the external controller informs the on-chip controller that the page is acceptable. The on-chip controller notes whether the page was obtained using sense times for the first or second read situation. Step 1664 includes reading another page of data on the one word line, and thereby obtaining two candidate pages of data. One of the candidate pages is selected based on the previously-noted first or second read situation, e.g., at step 1663. In another option, at step 1665, the external controller informs the on-chip controller that the page is unacceptable. In response, the on-chip controller provides the second candidate page to the external controller. Steps 1662-1664 may then be repeated, where the evaluation at step 1662 is for the second candidate page.

FIG. 17 depicts another example process for evaluating data in first and second sets of latches, consistent with steps 1307 and 1308 of FIG. 13A1. Step 1700 includes using a first subset of parity check equations for evaluating a page of data in a first set of latches (a first page) to determine a number N1 of parity check equations satisfied. In one approach, the subset comprises about 5-10% of the complete set of parity check equations. Step 1701 includes using the first subset of parity check equations for evaluating a page of data in second set of latches (a second page) to determine a number N2 of parity check equations satisfied. At decision step 1702, if N1−N2>margin, e.g., N1 exceeds N2 by a specified margin, step 1703 is used to select the data in the first set of latches as the read data which is output to the external controller and the process is done at step 1713. If decision step 1702 is false, a decision step 1704 determines if N2−N1>margin, e.g., N2 exceeds N2 by a specified margin. If decision step 1704 is true, step 1705 is used to select the data in the second set of latches as the read data. If decision step 1704 is false, step 1706 includes using a second subset of parity check equations for evaluating the page of data in the first set of latches to determine a number N1A of parity check equations satisfied. Step 1707 includes using a second subset of parity check equations for evaluating the page of data in the second set of latches to determine a number N2A of parity check equations satisfied.

At decision step 1708, if N1A−N2A>margin, step 1709 is used to select the data in the first set of latches as the read data and the process is done at step 1713. If decision step 1708 is false, a decision step 1710 determines if N2A−N1A>margin. If decision step 1710 is true, step 1711 is used to select the data in the second set of latches as the read data. If decision step 1710 is false, step 1712 is used to evaluate the data using one or more additional subsets of parity check equations.

This example determines a winner based on the evaluation of the most recent subset of equations. Another approach is to compare the results accumulated from the evaluation of multiple subsets of equations. For example, decision step 1708 could determine if (N1+N1A)−(N2+N2A)>margin, e.g., whether the sum of parity check equations satisfied by the first page across all the multiple subsets exceeds the sum of parity check equations satisfied by the second page across all the multiple subsets. The margin may be zero or more. The margin should be set so that a page can be declared as a winner (as the read data to output) with sufficient confidence.

FIG. 18 depicts an example of subsets of parity check equations, consistent with FIGS. 16A and 17. The subsets are identified as subset(1), subset(2) and so forth. As mentioned, in one example, each subset may comprise about 5-10% of the complete set of parity check equations. Typically, there can be hundreds or even thousands of parity check equations so that a subset can contain many equations.

FIG. 19A depicts another example of parity check equations. One example of an ECC is a low density parity check code. Such a code includes symbols x1, x2, x3, . . . which satisfy r parity checks equations in which various combinations of the symbols are added using modulo 2 addition. Each code word of length n can contain (n-r)=k information bits and r check bits. Moreover, a parity check matrix can be created in which the rows represent the equations and the columns represent the bits in the code word.

This simplified example involves n=12, where there are nine parity check equations in a complete set of equations 1900. The complete set may include three subsets 1905, 1910 and 1915, for example.

FIG. 19B depicts another example of parity check equations. Regarding the selection of the subset of parity check equations, in general, we have flexibility in selecting the subset. Typically, the parity check matrix has full rank. Hence, all parity check equations are independent. Although, there is a possibility to add dependent parity check equations. If both independent and dependent parity check equations are used, the subset can be configured so that it does not include parity check equations which depend on one another. That is, the subset only includes parity check equations.

In another approach, the parity check equations are selected to provide good coverage over all the code word bits. One approach involves selecting a set of structured parity check equations such that an equation j will select bits j+n*i, for some n and i=0, 1, 2, . . . ). For example, a subset 1925 within the set of parity check equations 1920 may include equation(j), equation(j+n), equation(j+2n) and so forth. For instance, if j=1 and n=12, we have equation(l), equation(13), equation(25) and so forth. These may represent the first, thirteenth, twenty fifth equations in an ordered set of parity check equations. Every nth equation may be selected for the subset, where n>1. In another approach, the parity check equations are selected randomly.

Figure 20:
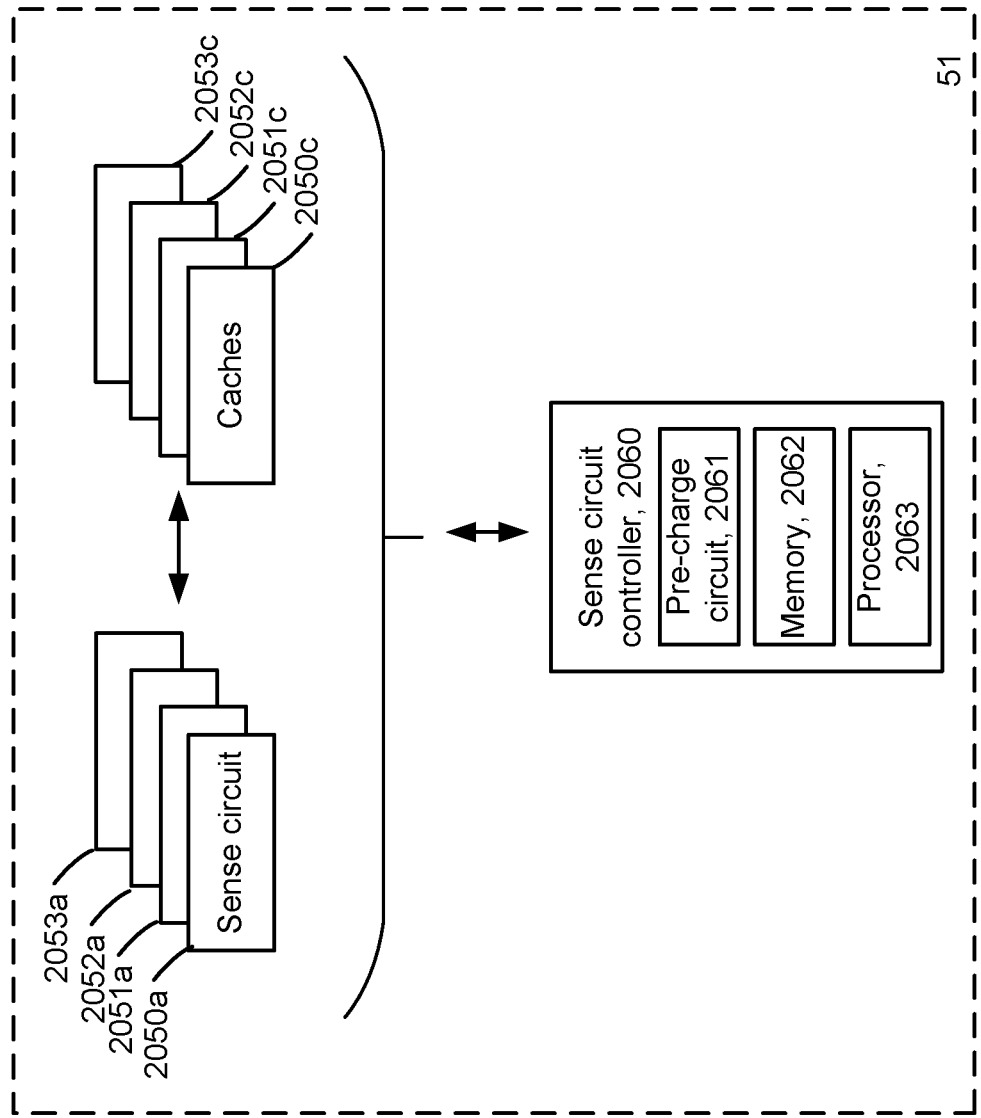
FIG. 20 depicts an example block diagram of a sense block 51 in the column control circuitry of FIG. 1A.

FIG. 20 depicts an example block diagram of a sense block 51 in the column control circuitry of FIG. 1A. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 2050a, 2051a, 2052a and 2053a are associated with caches 2050c, 2051c, 2052c and 2053c, respectively.

In one approach, different subsets of bit lines can be sensed using different respective sense blocks. This allows the processing load which is associated with the sense circuits to be divided up and handled by a respective processor in each sense block. For example, a sense circuit controller 2060 can communicate with the set, e.g., sixteen, of sense circuits and latches. The sense circuit controller may include a pre-charge circuit 2061 which provides a voltage to each sense circuit for setting a pre-charge voltage. The sense circuit controller may also include a memory 2062 and a processor 2063.

Further example details of the sense circuit controller and the sense circuits are provided below.

FIG. 21 depicts another example block diagram of a sense block 51 in the column control circuitry of FIG. 1B. The sense circuit controller 2160 communicates with multiple sense circuits including example sense circuits 2150a and 2151a. The sense circuit 2150a includes latches 2150b, including a trip latch 2126, a first data latch 2127 and a second data latch 2128, and data state latches 2128 (ADL). The sense circuit further includes a voltage clamp 2121 such as a transistor which sets a pre-charge voltage at a sense node 2122 (SEN). A sense node-to-bit line (BL) switch 2123 selectively allows the sense node to communicate with a bit line 2125, e.g., the sense node is electrically connected to the bit line so that the sense node voltage can decay. The bit line 2125 is connected to one or more memory cells, such as a memory cell MC1. A voltage clamp 2124 can set a voltage on the bit line, such as during a sensing operation or during a program voltage. A local bus, LBUS1, allows the sense circuit controller to communicate with components in the sense circuit, such as the latches 2150b and the voltage clamp in some cases. To communicate with the sense circuit 2150a, the sense circuit controller provides a voltage via a line 2102 to a transistor 2104 to connect LBUS1 with a data bus DBUS, 2103. The communicating can include sending data to the sense circuit and/or receive data from the sense circuit.

The sense circuit controller can communicate with different sense circuits in a time-multiplexed manner, for instance. A line 2105 may be connected to the voltage clamp in each sense circuit, in one approach.

The sense circuit 2151a includes latches 2151b, including a trip latch 2146, a first data latch 2147 and a second data latch 2148. A voltage clamp 2141 may be used to set a pre-charge voltage at a sense node 2142 (SEN). A sense node-to-bit line (BL) switch 2143 selectively allows the sense node to communicate with a bit line 2145, and a voltage clamp 2144 can set a voltage on the bit line. The bit line 2145 is connected to one or more memory cells such as a memory cell MC2. A local bus, LBUS2, allows the sense circuit controller to communicate with components in the sense circuit, such as the latches 2151b and the voltage clamp in some cases. To communicate with the sense circuit 2151a, the sense circuit controller provides a voltage via a line 2101 to a transistor 2106 to connect LBUS2 with DBUS. The lines 2101 and 2102 can be considered to be sense amplifier control (sac) lines.

The example memory cells MC1 and MC2 are connected to a selected word line WLn.

Figure 22:
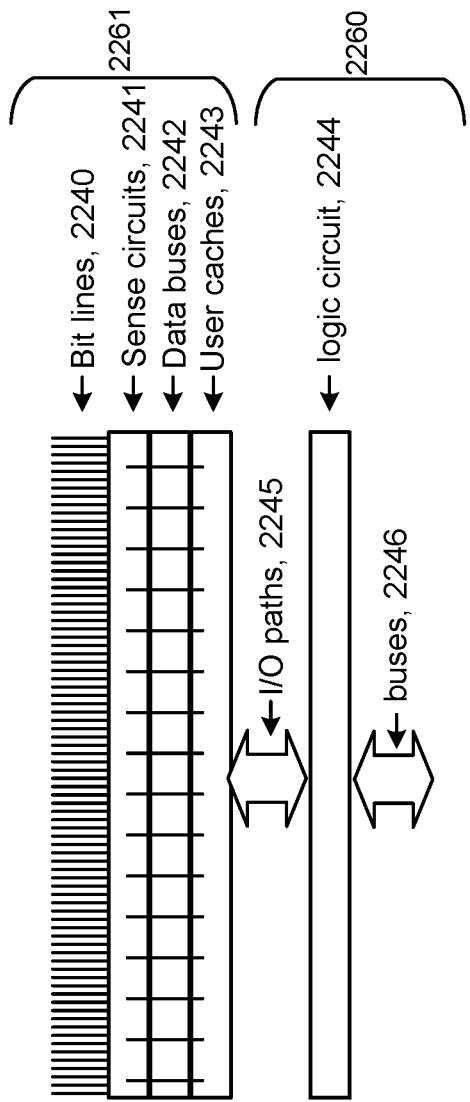
FIG. 22 depicts an example sensing circuit and input/output circuitry consistent with FIG. 21.

A cache may be associated with each sense circuit and connected to DBUS as depicted in FIG. 22.

The first data latches 2127 and 2147 may store a bit which results from the sensing of MC1 and MC2, respectively, at a first sensing time. The second data latches 2128 and 2148 may store a bit which results from the sensing of MC1 and MC2, respectively, at a second sensing time. If a single sensing time is used during a read voltage, both the first and second data latches may store a bit which results from this sensing. For each sense time, the trip latch may store bit=1 to denote the conductive state and bit=0 to denote the non-conductive state. In one approach, this bit is output to the sense circuit controller which determines a corresponding bit to be written to the first or second latch, consistent with the bit assignments of FIGS. 8B, 8D and 8F, for example.

FIG. 22 depicts an example sensing circuit and input/output circuitry consistent with FIG. 21. The sensing circuit 2261 includes a set of bits lines 2240, sense circuits 2241, data buses 2242 (DBUS), and user caches 2243. An input/output circuit 2260 comprises input/output paths 2245, a logic circuit 2244 and buses 2246 for communicating with an external host, external to the memory chip. The buses may extend to I/O pads on the chip. In one approach, a bit size of the input/output paths in bits is equal to a bit size of a word. The transfer of data to and from the sense circuits may occur separately for each page of data.

Figure 23:
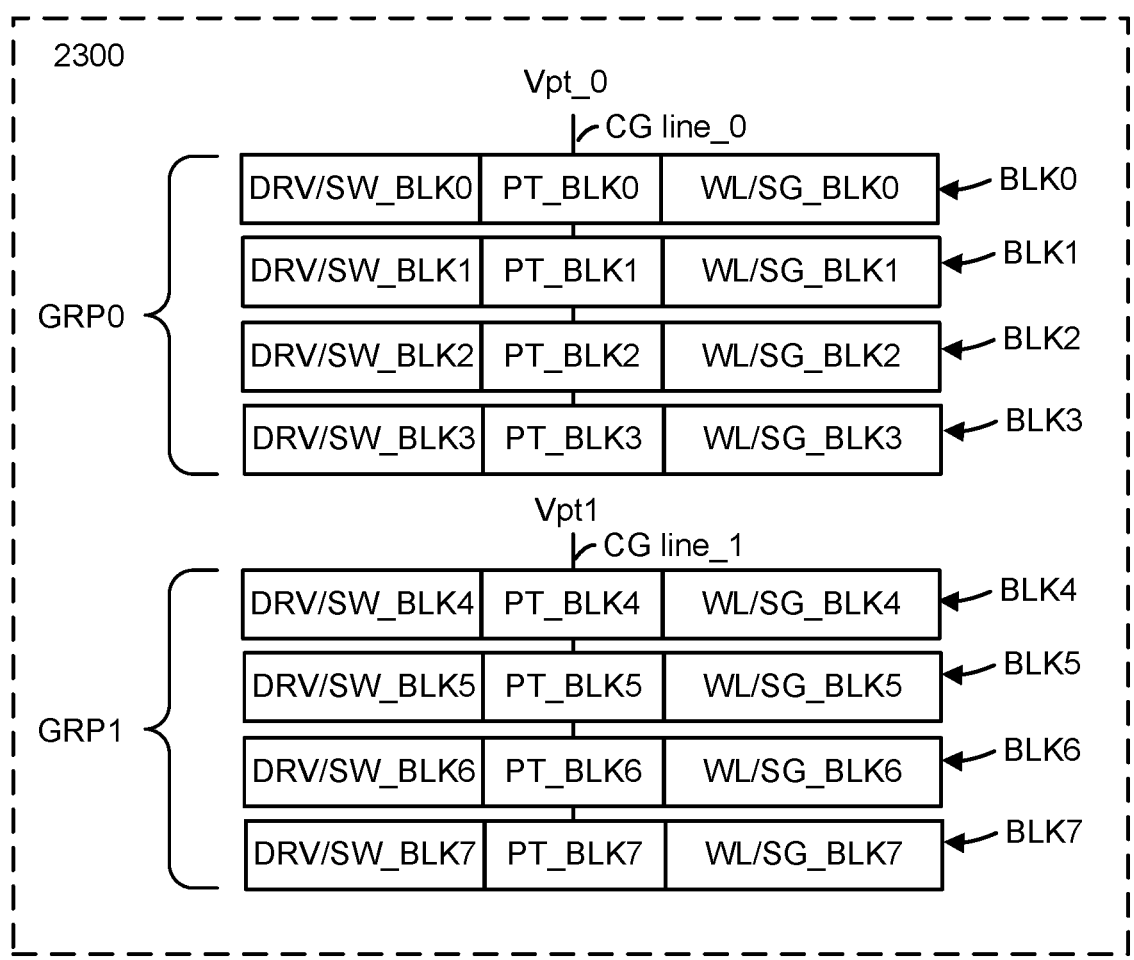
FIG. 23 depicts an example circuit comprising a first group of blocks GRP0 having a common control gate line (CG line_0) for pass transistors of the group, and a second group of blocks GRP1 having a common control gate line (CG line_1) for pass transistors of the group.

FIG. 23 depicts an example circuit 2300 comprising a first group of blocks GRP0 having a common control gate line (CG line_0) for pass transistors of the group, and a second group of blocks GRP1 having a common control gate line (CG line_1) for pass transistors of the group. Each group includes voltage drivers (DRV), switches (SW), pass transistors (PT) and word lines (WL) and select gate lines (SG) or a block. For example, in GRP0, a first block BLK0 includes DRV/SW_BLK0, PT_BLK0 and WL/SG_BLK0, a second block BLK1 includes DRV/SW_BLK1, PT_BLK1 and WL/SG_BLK1, a third block BLK2 includes DRV/SW_BLK2, PT_BLK2 and WL/SG_BLK2 and a fourth block BLK3 includes DRV/SW_BLK3, PT_BLK3 and WL/SG_BLK3. A common pass transistor voltage Vpt_0 is provided for GRP0 on a line CG line_0.

In GRP1, a fifth block BLK4 includes DRV/SW_BLK4, PT_BLK4 and WL/SG_BLK4, a sixth block BLK5 includes DRV/SW_BLK5, PT_BLK5 and WL/SG_BLK5, a seventh block BLK6 includes DRV/SW_BLK6, PT_BLK6 and WL/SG_BLK6 and an eighth block BLK7 includes DRV/SW_BLK7, PT_BLK7 and WL/SG_BLK7. A common pass transistor voltage Vpt_1 is provided for GRP1 on a line CG line_1.

Since the voltage drivers in a set of block share a common control gate line for pass transistors of the group, when a word line in one block is accessed, such as for programming or reading, the drivers of all four blocks will be connected to the word lines in both the accessed block and the remaining blocks. In some cases, the word lines in the remaining blocks may be driven with a relatively small voltage such as about 1 V which is available in the memory device as Vsource. As a result, the word line voltages which may be coupled up to about 4 V in the remaining blocks, may be pulled down to about 1 V, causing the remaining blocks to transition to the first read situation. This will increase read errors if the read voltages are optimized for the second read situation and one sense time is used. The technique of using two sense times can resolve this problem, since the data obtained using the sense time which corresponds to the first read situation will be selected. Another option is to drive the word lines of the remaining blocks at a higher level which is similar to the expected coupled up level.

Figure 24:
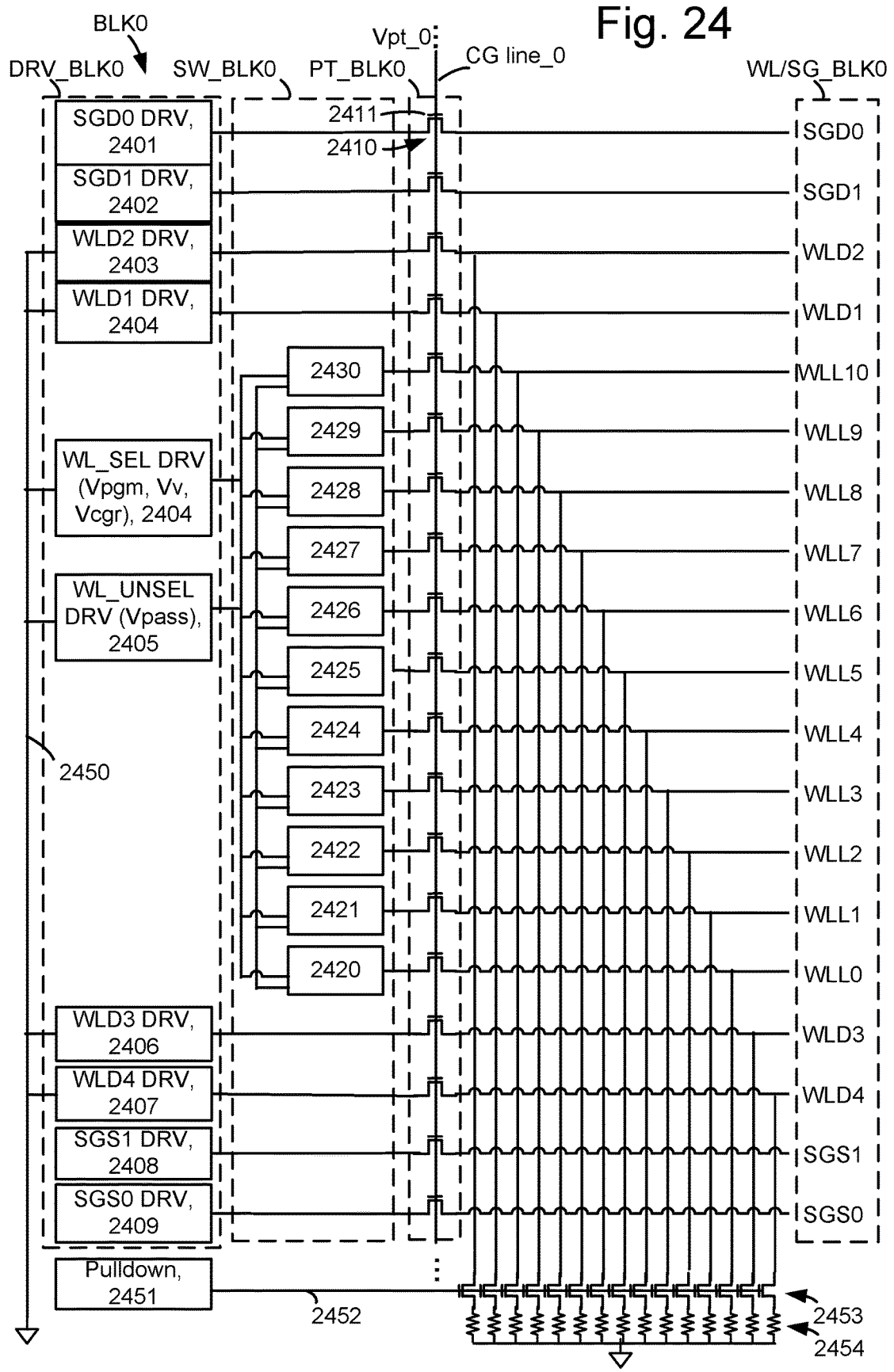
FIG. 24 depicts an example circuit which includes the voltage drivers DRV_BLK0, switches SW_BLK0, pass transistors PT_BLK0 and word lines and select gate lines WL/SG_BLK0 of BLK0 of FIG. 23.

FIG. 24 depicts an example circuit which includes the voltage drivers DRV_BLK0, switches SW_BLK0, pass transistors PT_BLK0 and word lines and select gate lines WL/SG_BLK0 of BLK0 of FIG. 23.

DRV_BLK0 includes various voltage drivers, such as charge pumps. These may be provided as part of the power control module 116 of FIG. 1A, for example. An SGD0 driver 2401 provides a voltage to an SGD0 control line. An SGD1 driver 2402 provides a voltage to an SGD1 control line. A WLD2 driver 2403 provides a voltage to a WLD2 word line. A WLD1 driver 2404 provides a voltage to a WLD1 word line. A WL_SEL driver 2404 provides a voltage to any of the data word lines WLL0-WLL10 which is selected for programming or reading. These voltages could include a program voltage Vpgm, a verify voltage Vv, and a read voltage Vcgr. Optionally, separate voltage drivers can be provided for these voltages.

A WL_UNSEL driver 2405 provides a voltage to any of the data word lines WLL0-WLL10 which is unselected. These voltages could include a pass voltage Vpass.

A WLD3 driver 2406 provides a voltage to a WLD3 word line. A WLD4 driver 2407 provides a voltage to a WLD4 word line. An SGS1 driver 2408 provides a voltage to an SGS1 control line. An SGS0 driver 2409 provides a voltage to an SGS0 control line.

A set of switches 2420-2430 in SW_BLK0 are responsive to control signals to pass the voltage from one of the drivers 2404 or 2405 to the respective data word line. Switches 2420, 2421, 2422, 2423, 2424, 2425, 2426, 2427, 2428, 2429 and 2430 are used for word lines WLL0-WLL10, respectively. The switches 2420-2430 can also be controlled to disconnect a driver from the respective data word line. For example, a driver can be disconnected to float the voltages of the data word lines as discussed to allow coupling up of the voltages.

PT_BLK0 includes an example pass transistor 2410 having a control gate 2411. As mentioned, the control gates of the pass transistors in a group of blocks are connected to one another and receive a common control gate voltage, e.g., Vpt_0.

The word line drivers can be connected to a ground path 2450 to provide grounding of the word lines, consistent with the second feature.

Further, a pulldown driver 2451 can provide a voltage on a path 2452 which causes transistors 2453 to enter a conductive state and thereby connect the word lines to a weak pulldown circuit comprising resistors 2454, consistent with the third feature. The pulldown can be to ground. The pulldown slowly pulls down the word line but does not interfere with other voltages on the word line such as for programming or reading. The pull down can always be on, whereas the grounding of the word lines occurs in specifically controlled time periods. The pulldown is a simpler approach.

This circuit solution adds a weak pulldown transistor connected to each word line plane, which may be gated and opened at specific timings, such that word line voltages will not float after being accessed. At the same time, the added weak pull down transistors will not disturb the driving of the word lines during read and program operations. The weak pulldown transistors will prevent or reduce coupling up of the word line voltage after a read operation, and will prevent attracting and trapping electrons in the ONO layer, which is a cause of the first read issue.

In one implementation, an apparatus comprises: word line layers separated by dielectric layers in a stack; a set of memory cells arranged along vertical pillars in the stack; and for each word line layer, a respective pulldown circuit. Each respective pulldown circuit comprises a transistor connected to a respective word line layer, and a resistor connected between the transistor and ground. Further, a control circuit is configured to provide the transistors in a conductive state during programming and reading operations in the stack.

In another implementation, an apparatus comprises: a set of memory cells, the memory cells are arranged in strings and connected to a set of word lines; a sense circuit connected to each string, each sense circuit comprising a sense node, a first latch and a second latch; and a control circuit. The control circuit is configured to, in response to a read command: apply a read voltage to a selected word line of the set of word lines; during application of the read voltage, for each sense circuit, charge the sense node, connect the sense node to one end of the string, determine voltages of the sense node at first and second times relative to a trip voltage, and store data in the first and second latches based on the determined voltages; evaluate the data in the first latches and second latches to determine which of the first latches and second latches includes data with fewest errors; and based on the evaluation, select the data in one of the first latches or the second latches including data with fewest errors as read data.

A related method comprises applying a read voltage to a selected word line of the set of word lines; during the read voltage, for each sense circuit, charging the sense node, connect the sense node to one end of the string, determining a voltage of the sense node at a first time, storing data in the first latch based on the voltage of the sense node at the first time, determining a voltage of the sense node at a second time, and store data in the second latch based on the voltage of the sense node at the second time; and selecting the data in the first latches or the data in the second latches, but not both the data in the first latches and the data in the second latches, as read data.

Another related apparatus includes means for performing each of the above steps. The means described above can include the components of the memory device 100 of FIG. 1A and FIG. 2, for example. The power control module 116, for instance, controls the power and voltages supplied to the word lines, select gate lines and bit lines during memory operations. Moreover, the means described above can include the components of FIG. 24 including the voltage drivers, switches and pass transistors. The means can further include any of the control circuits in FIGS. 1A and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
word line layers separated by dielectric layers in a stack;
a set of memory cells arranged along vertical pillars in the stack; and
for each word line layer, a respective pulldown circuit comprising a transistor and a resistor in a path which connects the word line layer to ground.

2. The apparatus of claim 1, wherein:
in each respective pulldown circuit, the resistor is connected between the transistor and ground.

3. The apparatus of claim 1, further comprising:
a driver, the driver configured to provide the transistors in a conductive state during driving of voltages on the word line layers for programming operations in the stack.

4. The apparatus of claim 1, further comprising:
a word line driver connected to the word line layers via respective paths; and
a pass transistor in each respective path, the respective pulldown circuits are connected to the respective paths which connect the word line driver to the word line layers between the pass transistors and the word line layers.

5. The apparatus of claim 4, wherein:
the pass transistors comprise control gates which are connected to one another and have a common control gate voltage.

6. The apparatus of claim 1, wherein:
the set of memory cells are arranged in NAND strings, each NAND string comprises select gate transistors; and
a pulldown circuit is not connected to the select gate transistors.

7. The apparatus of claim 1, wherein:
the word line layers comprise data word line layers and dummy word lines layers; and
the respective pulldown circuits are connected to the data word line layers and the dummy word lines layers.

8. The apparatus of claim 1, wherein:
the respective pulldown circuits are configured to dissipate voltages of the word line layers.

9. The apparatus of claim 1, wherein:
the respective pulldown circuits are configured to prevent or reduce coupling up of voltages of the word line layers after a sensing operation.

10. The apparatus of claim 4, wherein:
the respective pulldown circuits are configured to prevent floating of voltages of the word line layers after a sensing operation, when the word line driver is disconnected from the word line layers.

11. The apparatus of claim 1, wherein the word line layers comprise a selected word line layer of a sensing operation and unselected word line layers, further comprising:
a first word line driver connected to the selected word line layer;
a second word line driver connected to the unselected word line layers, the second word line driver configured to apply a pass voltage to the unselected word line layers while the first word line driver applies a sensing voltage to the selected word line layer; and
a pulldown circuit driver configured to connect the respective pulldown circuits to the word line layers after the sensing operation, when the second word line driver ramps down a voltage of the unselected word line layers from the pass voltage to a final level and the second word line driver is disconnected from the unselected word line layers.

12. The apparatus of claim 1, further comprising:
a driver, the driver configured to provide the transistors in a conductive state when voltages are driven on the word line layers for reading operations in the stack.

13. A method, comprising:
applying a sensing voltage to a selected word line among a plurality of word lines, wherein the plurality of word lines are connected to a set of memory cells and the memory cells are arranged in strings;

applying a pass voltage to unselected word lines of the plurality of word lines;

sensing a conductive state of selected memory cells in the set of memory cells during the applying of the sensing voltage and the applying of the pass voltage;

driving down voltages of the unselected word lines from the pass voltage to a final voltage; and pulling down the voltages of the unselected word lines after the driving down the voltages of the unselected word lines;

driving down a voltage of the selected word lines from the sensing voltage to a final voltage; and pulling down the voltage of the selected word line after the driving down the voltage of the selected word line.

14. The method of claim 13, wherein:
the pulling down the voltages comprises connecting a respective pulldown circuit to each word line of the unselected word lines.

15. The method of claim 13, wherein:
the pulling down the voltages comprises dissipating voltages of the unselected word lines.

16. The method of claim 13, wherein:
the pulling down the voltages comprises connecting each word line of the unselected word lines to ground via a respective resistor.

17. An apparatus, comprising:
a stack comprising alternating word line layers and dielectric layers;
a plurality of vertically extending NAND strings in the stack, each NAND string comprising a floating body channel;
a word line driver connected to the word line layers via respective paths;
a pass transistor in each path; and
for each word line layer, a respective pulldown circuit connected to each path between the pass transistor of the path and the word line layer, the respective pulldown circuit configured to pull down a voltage driven on the path by the word line driver.

18. The apparatus of claim 17, wherein:
each respective pulldown circuit comprises a transistor connected to one of the respective paths and a resistor connected between the transistor and ground.

19. The apparatus of claim 17, further comprising:
a pulldown circuit driver connected to control gates of the transistors of the pulldown circuits, the control gates are connected to one another.

* * * * *